United States Patent
Ohta et al.

(10) Patent No.: US 9,159,553 B2
(45) Date of Patent: Oct. 13, 2015

(54) SEMIPOLAR OR NONPOLAR NITRIDE-BASED DEVICES ON PARTIALLY OR FULLY RELAXED ALLOYS WITH MISFIT DISLOCATIONS AT THE HETEROINTERFACE

(75) Inventors: Hiroaki Ohta, Goleta, CA (US); Feng Wu, Goleta, CA (US); Anurag Tyagi, Goleta, CA (US); Arpan Chakraborty, Goleta, CA (US); James S. Speck, Goleta, CA (US); Steven P. DenBaars, Goleta, CA (US); Shuji Nakamura, Santa Barbara, CA (US); Erin C. Young, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 664 days.

(21) Appl. No.: 12/861,532

(22) Filed: Aug. 23, 2010

(65) Prior Publication Data

US 2011/0064103 A1   Mar. 17, 2011

Related U.S. Application Data

(60) Provisional application No. 61/236,058, filed on Aug. 21, 2009, provisional application No. 61/236,059, filed on Aug. 21, 2009.

(51) Int. Cl.
*H01S 5/00* (2006.01)
*H01L 21/02* (2006.01)
(Continued)

(52) U.S. Cl.
CPC .............. *H01L 21/0254* (2013.01); *B82Y 20/00* (2013.01); *H01L 21/0242* (2013.01);
(Continued)

(58) Field of Classification Search
CPC . H01L 21/02433; H01L 33/16; H01L 33/007; H01L 33/0075; H01L 21/02609; H01L 21/0237; H01L 21/02516; H01S 5/34333; H01S 5/2201; H01S 5/32341; H01S 2304/12; H01S 5/32; H01S 5/4031; H01S 5/4093
USPC .................. 372/43.01, 45.01, 45.012, 45.011; 257/13, E33.008, E21.211; 438/39, 41, 438/44, 47, 493, 503, 507, 508, 509
See application file for complete search history.

(56) References Cited

U.S. PATENT DOCUMENTS 6,325,850 B1 * 12/2001 Beaumont et al. .............. 117/95
6,389,051 B1    5/2002 Van de Walle et al.
(Continued)

FOREIGN PATENT DOCUMENTS

CN        1413358        4/2003
JP      2009038344       2/2009
(Continued)

OTHER PUBLICATIONS

Hirokuni Asamizu et al. "Demonstration of 426nm InGaN/GaN Laser Diodes Fabricated on Free-Standing Semipolar (1122) Gallium Nitride Substrates" Applied Physics Express 1 (2008).*
(Continued)

*Primary Examiner* — Jessica Stultz
*Assistant Examiner* — Delma R Forde
(74) *Attorney, Agent, or Firm* — Gates & Cooper LLP

(57) ABSTRACT

A dislocation-free high quality template with relaxed lattice constant, fabricated by spatially restricting misfit dislocation(s) around heterointerfaces. This can be used as a template layer for high In composition devices. Specifically, the present invention prepares high quality InGaN templates (In composition is around 5-10%), and can grow much higher In-composition InGaN quantum wells (QWs) (or multi quantum wells (MQWs)) on these templates than would otherwise be possible.

21 Claims, 17 Drawing Sheets

(51) Int. Cl.
*B82Y 20/00* (2011.01)
*H01L 33/00* (2010.01)
*H01S 5/32* (2006.01)
*H01S 5/343* (2006.01)
*H01L 33/06* (2010.01)
*H01L 33/12* (2010.01)
*H01L 33/16* (2010.01)
*H01L 33/32* (2010.01)
*H01S 5/20* (2006.01)
*H01S 5/22* (2006.01)

(52) U.S. Cl.
CPC .... *H01L21/02389* (2013.01); *H01L 21/02433* (2013.01); *H01L 33/0075* (2013.01); *H01S 5/3201* (2013.01); *H01S 5/3202* (2013.01); *H01S 5/34333* (2013.01); *H01L 33/06* (2013.01); *H01L 33/12* (2013.01); *H01L 33/16* (2013.01); *H01L 33/32* (2013.01); *H01S 5/2009* (2013.01); *H01S 5/2201* (2013.01); *H01S 2301/173* (2013.01)

(56) References Cited

U.S. PATENT DOCUMENTS

| | | | |
|---|---|---|---|
| 7,271,416 | B2 | 9/2007 | Saxler |
| 7,361,576 | B2* | 4/2008 | Imer et al. ............... 438/479 |
| 7,790,584 | B2* | 9/2010 | Paek et al. ............... 438/507 |
| 8,179,943 | B2* | 5/2012 | Okhotnikov et al. .... 372/45.013 |
| 2002/0192959 | A1 | 12/2002 | Shibata et al. |
| 2003/0092230 | A1 | 5/2003 | Koike et al. |
| 2006/0027831 | A1 | 2/2006 | Kioke et al. |
| 2006/0205199 | A1 | 9/2006 | Baker et al. |
| 2006/0270076 | A1 | 11/2006 | Imer et al. |
| 2007/0101932 | A1* | 5/2007 | Schowalter et al. ......... 117/952 |
| 2009/0194761 | A1 | 8/2009 | Masui et al. |
| 2009/0252191 | A1* | 10/2009 | Kubota et al. ............. 372/50.11 |
| 2010/0046567 | A1* | 2/2010 | Liliental-Weber et al. ............. 372/45.011 |
| 2010/0051900 | A1* | 3/2010 | Huffaker et al. ............. 257/13 |
| 2010/0127236 | A1 | 5/2010 | Bour et al. |
| 2010/0264460 | A1* | 10/2010 | Grandusky et al. ........... 257/190 |
| 2011/0049568 | A1* | 3/2011 | Lochtefeld et al. .......... 257/190 |
| 2011/0062415 | A1* | 3/2011 | Ohta et al. ................ 257/14 |
| 2011/0182311 | A1 | 7/2011 | Yoshizumi et al. |
| 2011/0309328 | A1* | 12/2011 | Kyono et al. .............. 257/13 |
| 2012/0091465 | A1* | 4/2012 | Krames et al. .............. 257/76 |
| 2012/0100650 | A1* | 4/2012 | Speck et al. ............... 438/31 |
| 2012/0104360 | A1* | 5/2012 | Hardy et al. ............... 257/18 |
| 2012/0114002 | A1* | 5/2012 | Enya et al. ................ 372/46.01 |

FOREIGN PATENT DOCUMENTS

| | | |
|---|---|---|
| JP | 2009111012 | 5/2009 |
| JP | 2010114418 | 5/2010 |
| WO | WO2006106170 | 10/2006 |
| WO | 2009097622 | 8/2009 |

OTHER PUBLICATIONS

F. Wu et al, "Misfit dislocation formation at heterointerfaces in (Al,In)GaN heteroepitaxial layers grown on semipolar free-standing GaN substrates" Journal of Applied Physics 109, (2011).*
Anurag Tyagi et al. "Partial strain relaxation via misfit dislocation generation at heterointerfaces in (Al,In)GaN epitaxial layers grown on semipolar (112$^-$2) GaN free standing substrates" Applied Physics Letters 95, (2009).*
S. Srinivasan et al. "Slip systems and misfit dislocations in InGaN epilayers" Applied Physics Letters vol. 83, No. 25 Dec. 22, 2003.*
A. E. Romanov et al. "Stress relaxation in mismatched layers due to threading dislocation inclination" Applied Physics Letters vol. 83, No. 13 Sep. 29, 2003.*
J. A. Floro et al. "Misfit dislocation formation in the AlGaN/GaN heterointerface" Journal of Applied Physics vol. 96, No. 12 Dec. 15, 2004.*
R. Liu et al. "Generation of misfit dislocations by basal-plane slip in InGaN/GaN heterostructures" Applied Physics Letters 89, (2006).*
Yohei Enya et al. "531nm Green Lasing of InGaN Based Laser Diodes on Semi-Polar {20$\bar{2}$1} Free-Standing GaN Substrates" Applied Physics Express 2 (2009).*
Takashi Mukai et. al., "Characteristics of InGaN-Based UV/Blue/Green/Amber/Red Light-Emitting Diodes" Jpn. J. Appl. Phys. vol. 38 (1999) pp. 3976-3981; Part 1, No. 7A, Jul. 1999.*
PCT Search Report, PCT/US2010/046341, dated Oct. 7, 2010.
Chuang, S., Physics of Optoelectronic Devices, pp. 146-154.
Speck, J., Progress in nonpolar materials and devices, Presentation Slides, at the 2009 Annual Review for the Solid State Lighting and Energy Center (SSLEC), University of California, Santa Barbara (Nov. 5, 2009).
Tyagi, A. et al., "Partial strain relaxation via misfit dislocation generation at heterointerfaces in (Al,In)GaN epitaxial layers grown on semipolar (1122) GaN free standing substrates," Applied Physics Letters 95, 251905 (2009).
Vurgaftman, I. et al., "Band parameters for nitrogen-containing semiconductors," Journal of Applied Physics, vol. 94, No. 6, Sep. 15, 2003, 3675.
Yamaguchi, A., "Anisotropic optical matrix elements in strained GaN quantum wells on semipolar and nonpolar substrates," Jpn. J. Appl. Phys., vol. 46, No. 33, 2007, pp. L789-L791.
Yamaguchi, A., "Anisotropic optical matrix elements in strained GaN-quantum wells with various substrate orientations," Phys. Stat. Sol. (c) 5, No. 6, 2329-2332 (2008).
Yamaguchi, A., "Theoretical investigation on polarization control of semipolar-oriented InGaN quantum-well emission using (Al)InGaN alloy substrates," Applied Physics Letters 94, 201104 (2009).
Young, E. et al., "Lattice tilt and misfit dislocations in (1122) semipolar GaN heteroepitaxy," Applied Physics Express 3 (2010) 011004.
Extended European Search Report dated Sep. 5, 2013 for European Patent Application No. 10810719.4.
Baker, Troy J., et al., "Characterization of Planar Semipolar Gallium Nitride Films on Spinel Substrates", Japanese Journal of Applied Physics (JJAP), 2005, pp. 920-922, vol. 44, No. 29, XP-002601934.
Sawaki, Nobuhiko, et al., "Growth and properties of semi-polar GaN on a patterned silicon substrate", Journal of Crystal Growth, 2009, pp. 2867-2874, vol. 311, No. 10, XP-026140890.
Chinese Office Action (with English translation) dated Apr. 1, 2014 for Chinese Patent Application No. 201080037288.X.
Japanese Office Action (with English translation) dated Mar. 14, 2014 for Japanese Patent Application No. 2012-525757.
Chinese Office Action (with English translation) dated Jun. 3, 2014 for Chinese Patent Application No. 201080037329.5.
PCT International Search Report and Written Opinion dated Feb. 17, 2012 for PCT Application No. PCT/US2011/058372.
Chinese Office Action (with English translation) dated Mar. 31, 2015 for Chinese Patent Application No. 201080037329.5.

* cited by examiner

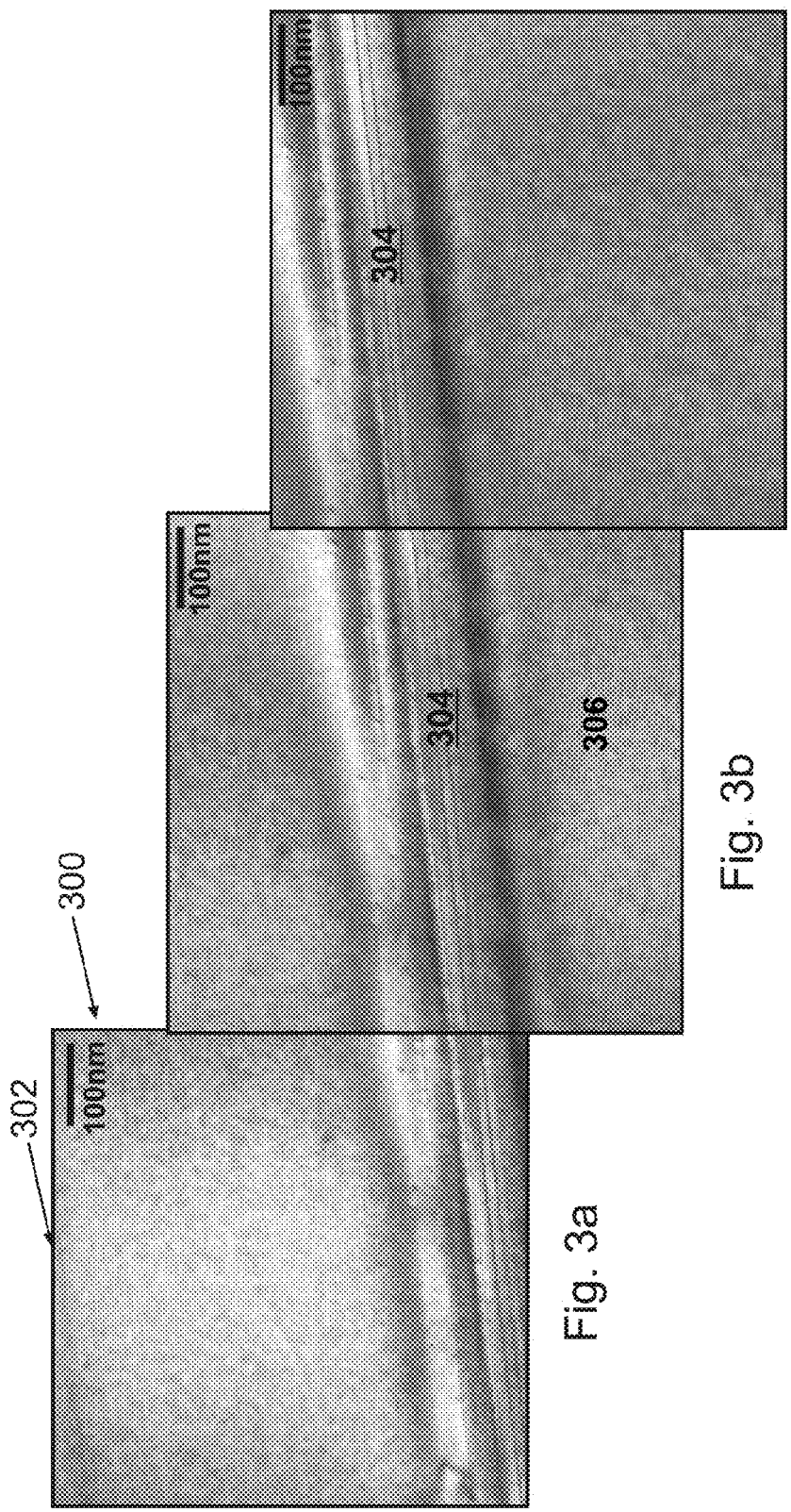

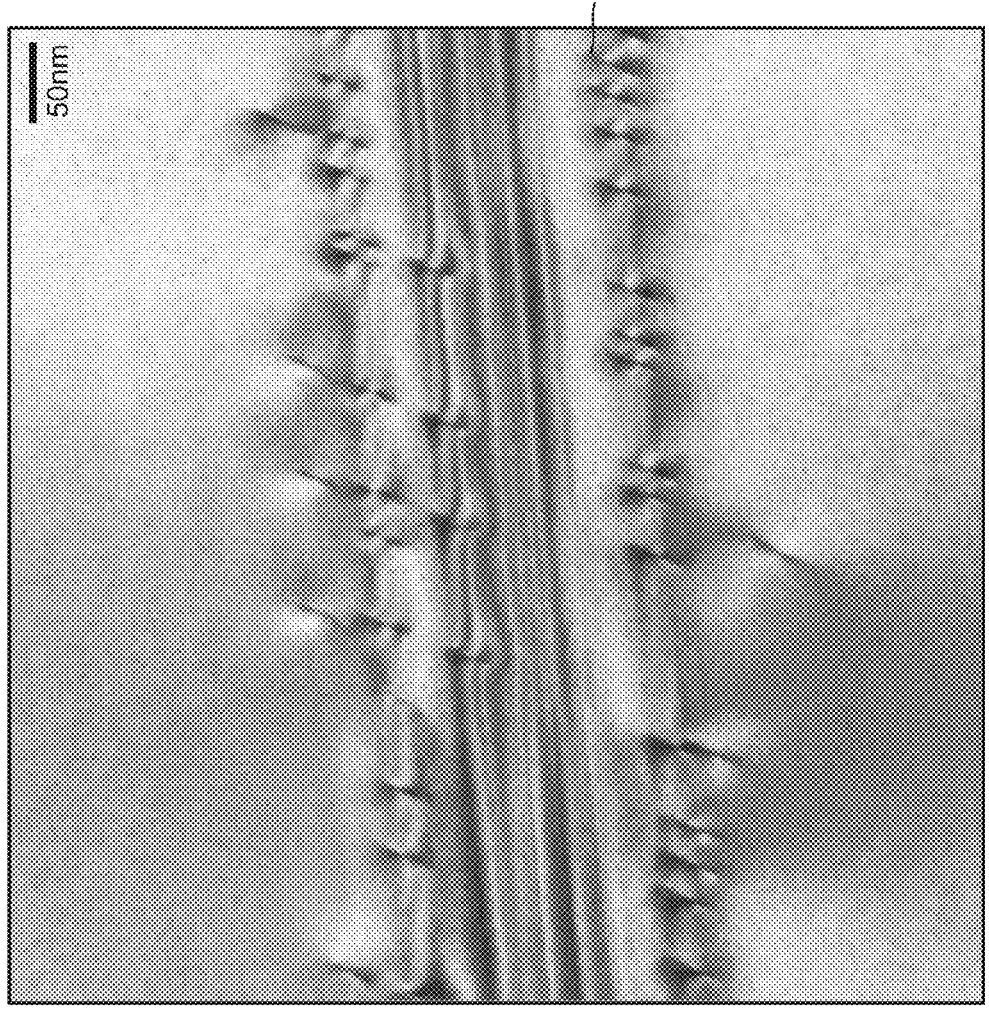
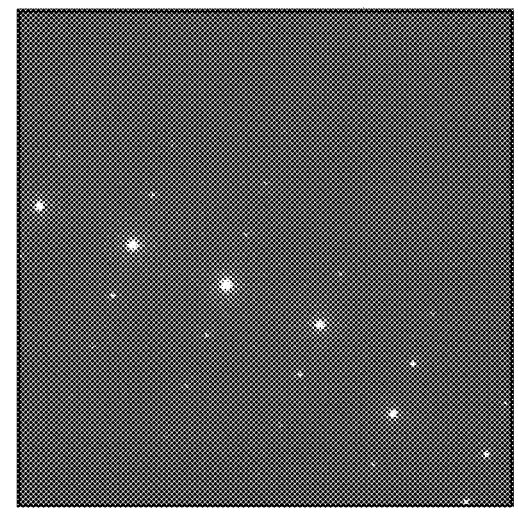
Fig. 6a
Fig. 6b

SEMIPOLAR OR NONPOLAR NITRIDE-BASED DEVICES ON PARTIALLY OR FULLY RELAXED ALLOYS WITH MISFIT DISLOCATIONS AT THE HETEROINTERFACE

CROSS REFERENCE TO RELATED APPLICATIONS

This application claims the benefit under 35 U.S.C. Section 119(e) of the following and commonly assigned U.S. Provisional Patent Applications:

U.S. Provisional Patent Application Ser. No. 61/236,058 filed on Aug. 21, 2009, by Hiroaki Ohta, Feng Wu, Anurag Tyagi, Arpan Chakraborty, James S. Speck, Steven P. DenBaars and Shuji Nakamura, entitled "SEMIPOLAR NITRIDE-BASED DEVICES ON PARTIALLY OR FULLY RELAXED ALLOYS WITH MISFIT DISLOCATIONS AT THE HETEROINTERFACE"; and U.S. Provisional Application Ser. No. 61/236,059, filed on Aug. 21, 2009 by Hiroaki Ohta, Feng Wu, Anurag Tyagi, Arpan Chakraborty, James S. Speck, Steven P. DenBaars, and Shuji Nakamura, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS;"

which applications are incorporated by reference herein.

This application is related to the following and commonly-assigned U.S. patent application:

U.S. Utility application Ser. No. 12/861,652, filed on Aug. 23, 2010, by Hiroaki Ohta, Feng Wu, Anurag Tyagi, Arpan Chakraborty, James S. Speck, Steven P. DenBaars, and Shuji Nakamura, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS," which application claims the benefit under 35 U.S.C. Section 119(e) of U.S. Provisional Application Ser. No. 61/236,059, filed on Aug. 21, 2009 by Hiroaki Ohta, Feng Wu, Anurag Tyagi, Arpan Chakraborty, James S. Speck, Steven P. DenBaars, and Shuji Nakamura, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS;"

which application is incorporated by reference herein.

BACKGROUND OF THE INVENTION

1. Field of the Invention

This invention relates to dislocation free high quality epitaxially grown templates with relaxed lattice constants by using spatially restricted misfit dislocations (MDs) around heterointerfaces, wherein the template layer can be used for epitaxial growth of high In/Al composition devices, such as ultraviolet (UV), green, amber, or red Light Emitting Diodes (LEDs) and green or UV Laser Diodes (LDs).

2. Description of the Related Art

So far, all nitride-based devices are typically grown coherently because dislocations which pass through device layers cause poor device performance. For example, if InGaN is grown coherently on GaN, i.e. without MDs, the in-plane lattice constant of InGaN is constrained to the same value as GaN, which means InGaN layers suffer from compressive in-plane strain (for the case of coherent growth of AlGaN on GaN, the AlGaN epitaxial layer suffers from tensile in-plane strain due to the difference of respective lattice constants).

An approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero l Miller index. Thus, semipolar planes are defined as crystal planes with nonzero h or k or i index and a nonzero l index in the (hkil) Miller-Bravais indexing convention. Some commonly observed examples of semi-polar planes in c-plane GaN heteroepitaxy include the (11-22), (10-11), and (10-13) planes, which are found in the facets of pits. These planes also happen to be the same planes that the inventors have grown in the form of planar films. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

SUMMARY OF THE INVENTION

The present invention discloses a dislocation-free high quality template with relaxed lattice constant, by spatially restricting MDs around heterointerfaces. This template layer can be used for subsequent epitaxial growth of high In composition devices. The present invention prepares high quality InGaN templates (In composition is around 5-10%), and can grow much higher In-composition InGaN quantum wells (QWs) (or multi quantum wells (MQWs)) on these templates than would otherwise be possible.

To overcome the limitations in the prior art, and to overcome other limitations that will become apparent upon reading and understanding the present specification, the present invention discloses a first layer that is a semipolar nitride (AlInGaN) layer having a lattice constant that is partially or fully relaxed, deposited on a second layer, wherein there are one or more dislocations at a heterointerface between the first layer and the second layer.

The dislocations may be MDs. The dislocations may be localized around the heterointerface or may not penetrate through layers above the heterointerface.

A growth plane of the first layer may be a semipolar plane that is a (11-22), (10-1-1) or (10-1-3) plane.

The second layer may be bulk AlInGaN, a GaN substrate, an m-sapphire or spinel substrate, for example.

The first layer may be InGaN having an In composition of at least several percent (e.g., 3-10%), and the second layer is GaN, for example. Alternatively, the first layer may be AlGaN having an Al composition of at least several percent, and the second layer may be GaN, for example. The first layer may comprise more than two layers and at each interface there exists dislocations allowing relaxed epitaxial films.

A III-Nitride optical device may be fabricated on the first layer. The III-Nitride optical device may include one or more AlIn$_x$GaN (x>0) QWs, wherein x is more than 20%. The optical device may be a green LD comprising high In composition QWs that enable light emission having a peak intensity in a green wavelength range.

The QWs may be at least 3 nm thick.

The III-Nitride optical device may be an LED or LD comprising a light emitting active layer between an n-type layer and a p-type layer.

The III-Nitride optical device may include no new dislocations inside the device structure, in particular around one or more active layers of the optical device, or dislocations may be at least 50 nm from the active layer. A number (n) of threading dislocations per unit area in the substrate layer may be in a range $10^3$-$10^6$ per $cm^2$.

The present invention further discloses a method of fabricating a III-Nitride device, comprising growing the III-Nitride device coherently on a III-Nitride template, wherein the III-Nitride template is grown non-coherently on a substrate having a different material composition than the III-Nitride template.

BRIEF DESCRIPTION OF THE DRAWINGS

Referring now to the drawings in which like reference numbers represent corresponding parts throughout:

FIGS. 3(a)-(c) show TEM images of the different epitaxial layers of the aforementioned device (depicted in FIGS. 1, 2(a)), for (a) showing a 100 period p-AlGaN/GaN SL and 100 nm thick p-GaN, wherein the p-AlGaN in the SL is 3 nm thick and the GaN in the superlattice is 2 nm thick, (b) an active region with 2-period InGaN QW, and (c) an n-AlGaN/GaN SL below the QWs, wherein the scale is 100 nm.

FIG. 6(a) is a TEM bright field image taken with g=01-10, wherein the MDs are seen as a segment due to tilting of the specimen from [1-100] to [2-1-10], wherein the scale is 50 nm, and FIG. 6(b) depicts the corresponding electron beam DP.

DETAILED DESCRIPTION OF THE INVENTION

Figure 1:
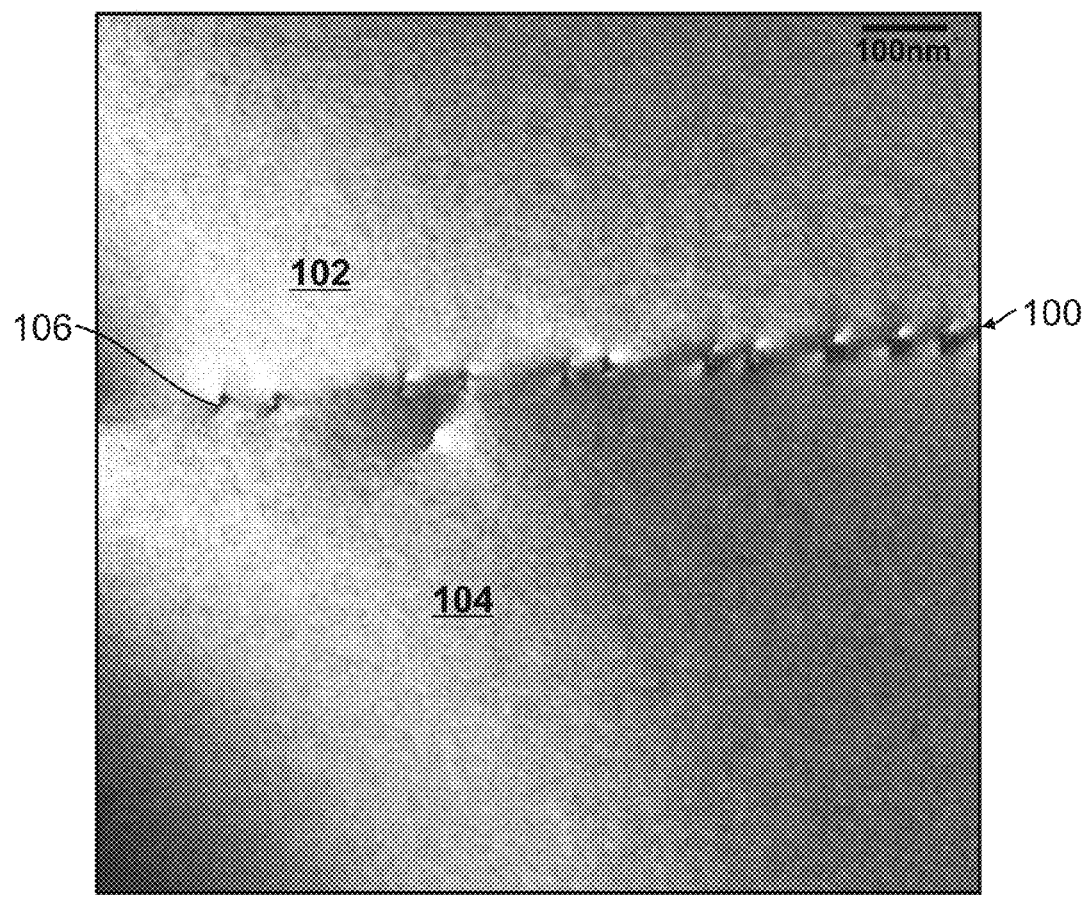
FIG. 1 is a transmission electron microscope (TEM) bright field image taken with g=01-10 diffraction condition around the interface of the lower part of an AlGaN/GaN superlattice (SL) with GaN, showing MDs at the interface, wherein the scale is 100 nanometers (nm).

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

An epitaxial layer (X) grown on another layer (Y), wherein layer Y could itself be epitaxial or else a substrate, can be coherent, or partially relaxed, or fully relaxed, with respect to Y. For the case of coherent growth, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed. In some cases, the substrate might have some residual strain.

The present invention discovered the existence of MDs at heterointerfaces in semipolar (11-22) nitride (see FIGS. 1, 2(a)-(b), 3(a)-(c), 4, 5(a)-(b), and 6(a)-(b)). In this new discovery, the presence of MD was restricted to only around heterointerfaces between layers with lattice constant mismatch (with different alloys and/or alloy compositions). The layer grown on this interface (with MDs) was considered to be partially or fully relaxed. As a result, when the InGaN (relatively high In composition, e.g., 5-10%) is grown using the present invention, a relaxed InGaN template layer (relaxed: lattice constant becomes its natural value) is achieved.

If InGaN is grown coherently on GaN, i.e. without MDs, the in-plane lattice constant of InGaN is constrained to the same value as GaN, which means InGaN layers suffer from compressive in-plane strain (for the case of coherent growth of AlGaN on GaN, the AlGaN epitaxial layer suffers from tensile in-plane strain due to the difference of respective lattice constants). Based on TEM images in preliminary experiments (see FIGS. 1, 2(a)-(b), 3(a)-(c), 4, 5(a)-(b), and 6(a)-(b)), the layer on the MD had no clear dislocation through the layers and toward growth directions, except for dislocations around interfaces. This indicates the present invention can achieve a dislocation-free alloy, with relaxed lattice constant, on a substrate.

For the relaxed layer, the present invention can grow a thick layer without regard to the critical growth thickness. One application is a high quality InGaN template on GaN. This template can be used to grow extremely high In composition device structures, such as green LEDs, amber LEDs, red LEDs, and green LDs.

TECHNICAL DESCRIPTION

Nomenclature

The terms (Al,Ga,In)N, III-Nitride, or AlInGaN, as used herein is intended to be broadly construed to include respective nitrides of the single species, Al, Ga, and In, as well as binary, ternary and quaternary compositions of such Group III metal species. Accordingly, the term (Al, Ga, In)N, or AlInGaN, or III-Nitride comprehends the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials.

Device Structure

FIG. 1 is a TEM bright field image taken with g=01-10 diffraction condition around the interface 100 of the lower part of an AlGaN/GaN SL 102 with GaN 104, showing MDs 106 at the interface (this is the same as FIG. 3(b) of [1]).

Figure 2A:
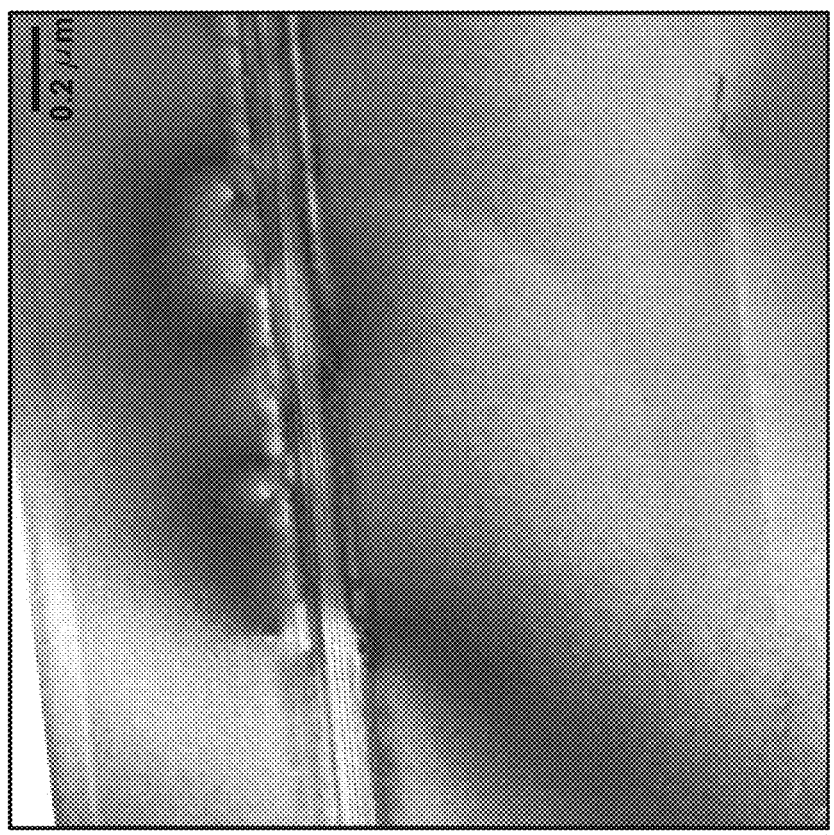
FIG. 2(a) is a TEM image around the [1-100] zone axis, wherein the whole LD device epitaxial layers (from top to bottom), including the SL, can be seen, and the scale is 0.2 micrometers (μm)
Figure 2B:
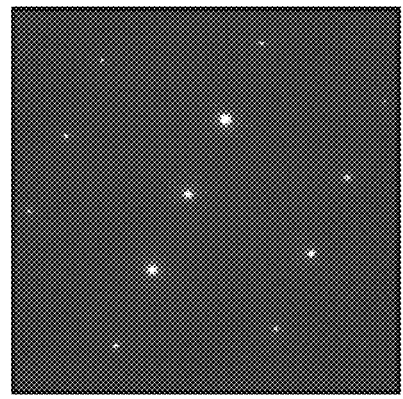
FIG. 2(b) depicts the corresponding electron beam diffraction pattern (DP).

FIG. 2(a) is a TEM image around the [1-100] zone axis, wherein the whole LD device epitaxial layers (from top to bottom), including the SL, can be seen, and FIG. 2(b) depicts the corresponding electron beam diffraction pattern (DP).

FIGS. 3(a)-(c) show TEM images of the different epitaxial layers of the aforementioned device (depicted in FIGS. 1, 2(a)), showing (a) a 100 period p-AlGaN/GaN SL 300 and a 100 nm thick p-GaN 302, wherein the p-AlGaN in the SL 300 is 3 nm thick, the GaN in the SL 300 is 2 nm thick, (b) an active region 304 with 2-period InGaN QW, and (c) an n-AlGaN/GaN SL 306 below the QWs.

Figure 4:
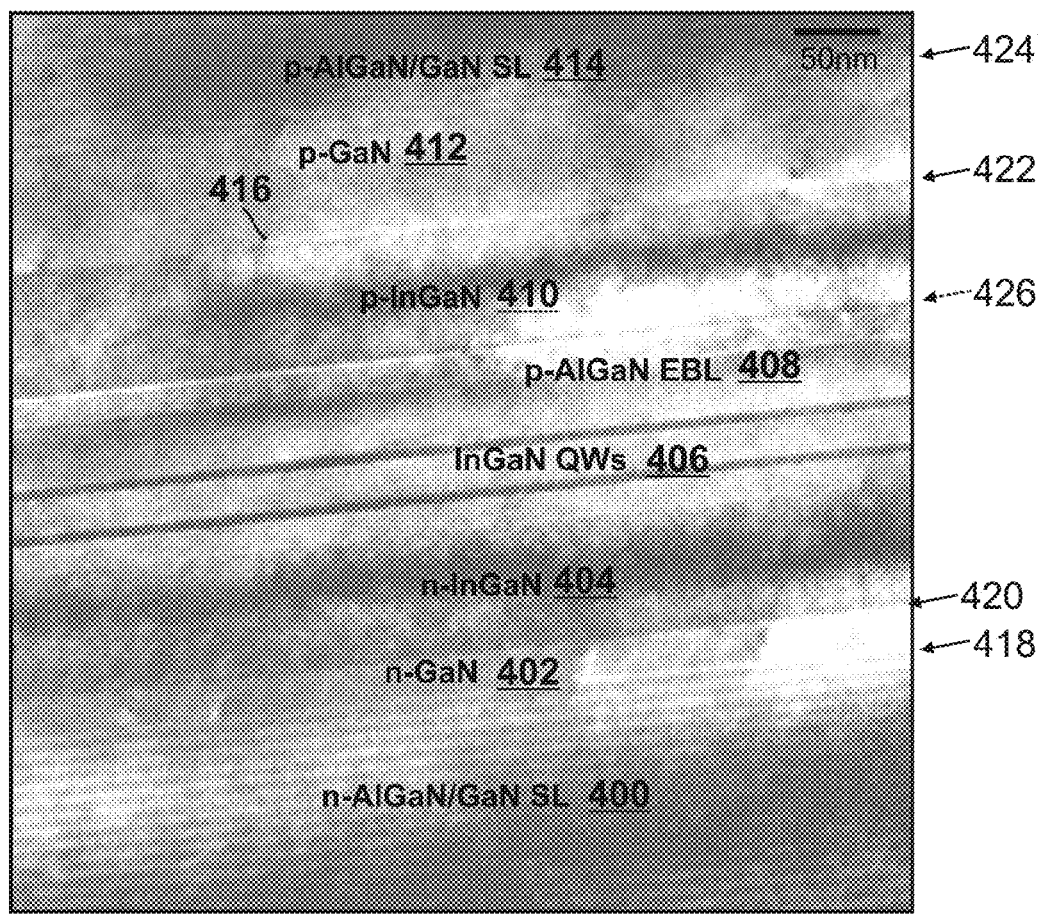
FIG. 4 is a TEM image illustrating MDs mainly generated at the heterointerfaces marked with black arrows, and slightly found in the layer marked with the broken arrow, wherein the scale is 50 nm.

FIG. 4 is a TEM image illustrating an epitaxial structure comprising an n-AlGaN/GaN SL 400, an n-GaN layer 402 on the SL 400, an n-InGaN layer 404 on the n-GaN layer 402, InGaN QWs 406 on the n-InGaN layer 404, a p-AlGaN electron blocking layer (EBL) 408 on the QWs 406, a p-InGaN layer 410 on the EBL 408, a p-GaN layer 412 on the p-InGaN layer 410, and a p-AlGaN/GaN SL 414 on the p-GaN layer 412. The TEM image further illustrates MDs 416 mainly generated at the heterointerfaces marked with black arrows 418, 420, 422, 424, and slightly found in the layer marked with the broken arrow 426.

Figure 5B:
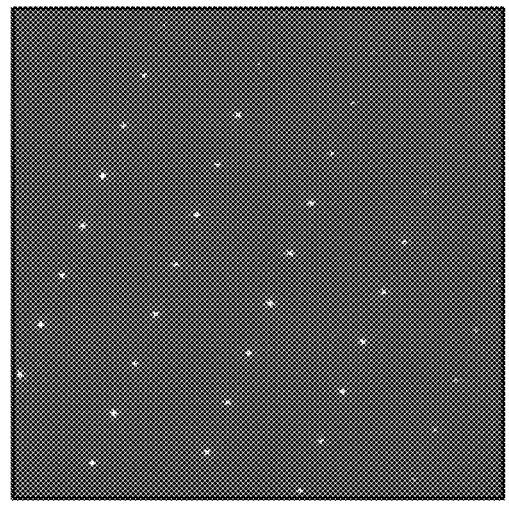
FIG. 5(b) depicts the corresponding electron beam DP [1].
Figure 5A:
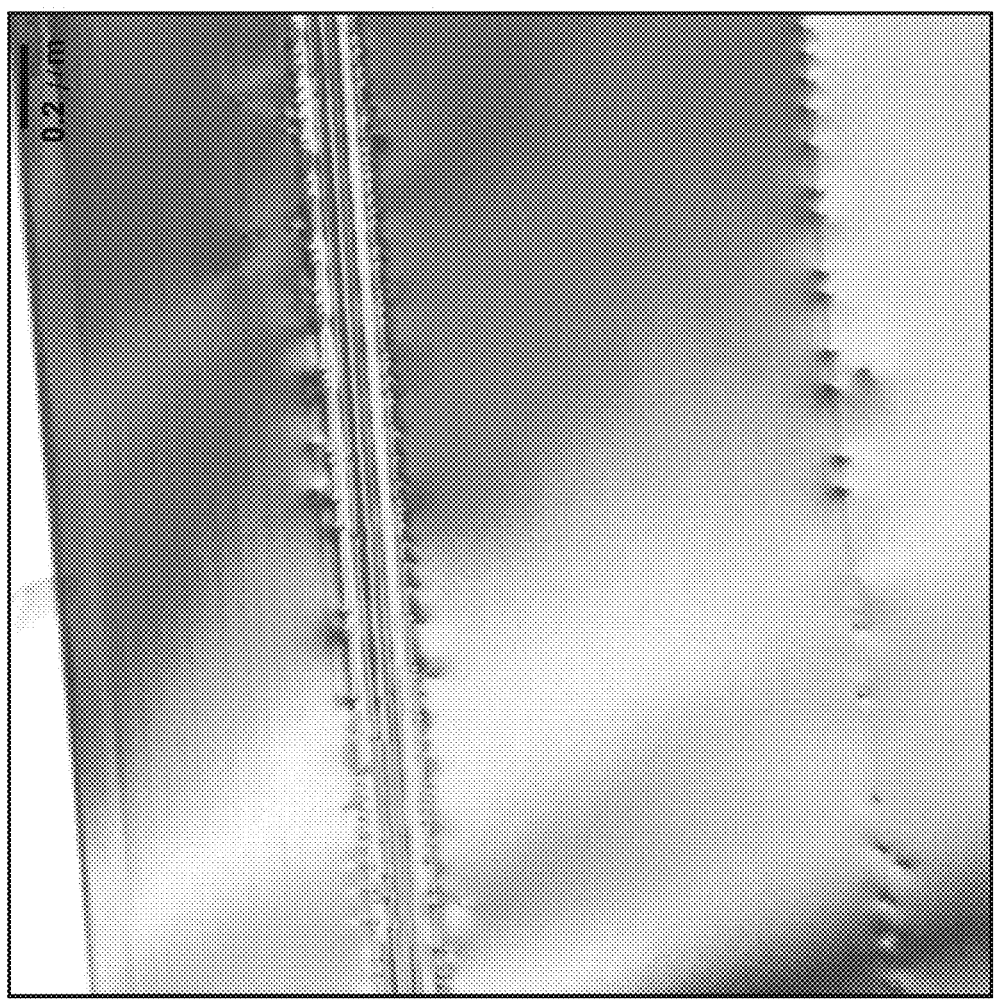
FIG. 5(a) is a TEM image taken from the zone axis [2-1-10], wherein the scale is 0.2 μm.

FIG. 5(a) is a TEM image taken from the zone axis [2-1-10], and FIG. 5(b) depicts the corresponding electron beam DP [1].

FIG. 6(a) is a TEM bright field image taken with g=01-10, wherein the MDs 600 are seen as a segment due to tilting of the specimen from [1-100] to [2-1-10], and FIG. 6(b) depicts the corresponding electron beam DP.

Figure 7:
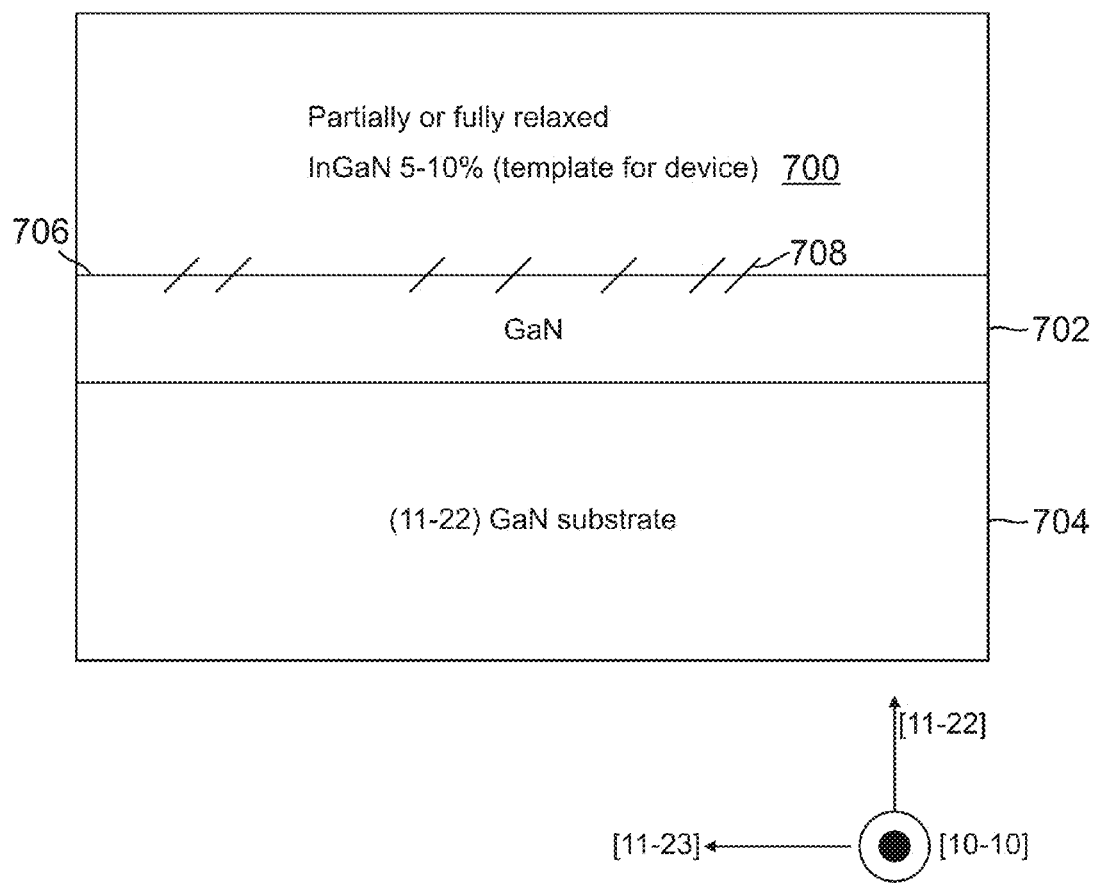
FIG. 7 is a cross-sectional schematic of a concept of the present invention.

The present invention can prepare a high quality InGaN template (In composition is around 5-10%), and can grow much higher In-composition InGaN QWs (MQWs) on this template. FIG. 7 illustrates a structure that embodies this concept for the present invention, comprising the thick InGaN template layer 700 (with 5-10% In) heteroepitaxially grown on a GaN layer 702, and the GaN layer 702 homoepitaxially grown on a (11-22) GaN substrate 704. The heterointerface 706 between the GaN layer 702 and the InGaN template layer 700 contains localized (i.e., confined to the vicinity of the interface 706) MDs 708, and the InGaN template 700 (e.g. for a device) has a partially or fully relaxed lattice constant. In FIG. 7, arrows labeled [11-22] and [11-23] indicate the [11-23] and [11-23] directions, respectively, and the solid circle within a circle indicates the [10-10] direction (out of the plane of the paper).

Figure 8:
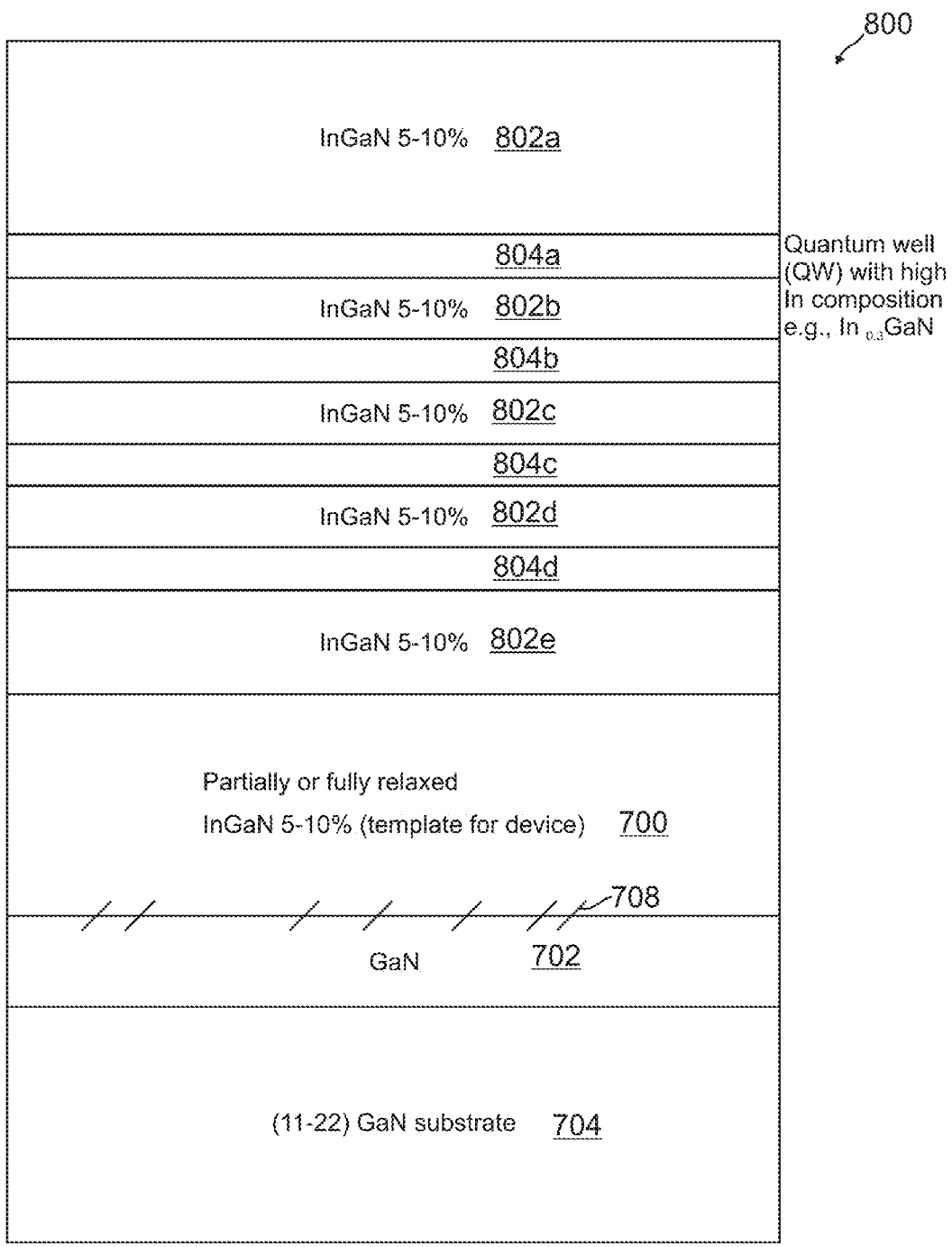
FIG. 8 is a cross-sectional schematic of an application of the present invention, a bright green LED or green LD, for example.

FIG. 8 illustrates an application of the present invention, a bright green LED or LD structure 800 comprising InGaN layers 802a, 802b, 802c, 802d, 802e (with 5-10% Indium (In)) and high-In content, e.g. $In_{0.3}GaN$ QW layers 804a, 804b, 804c, 804d, grown on the InGaN template 700 described in FIG. 7. The QWs are light emitting active layers that have sufficiently high In composition to emit the green light (e.g., light having a peak intensity in the green wavelength range, e.g., 510 nm-540 nm, or in a wavelength range from 490 nm-560 nm). The template 700 comprises a relaxed lattice constant wherein the relaxation occurs in the direction [10-10] perpendicular to the MD line direction (indicated by arrow [11-23] in FIG. 7). Layer 802a is p-type layer (e.g., Mg doped), layer 802e is an n-type layer (e.g., Si doping), and layers 802b-d are barrier layers in the active region (non-doped or n-doped). FIG. 8 is an example of device application, so a kind of pn-diode with MQWs.

Figure 9:
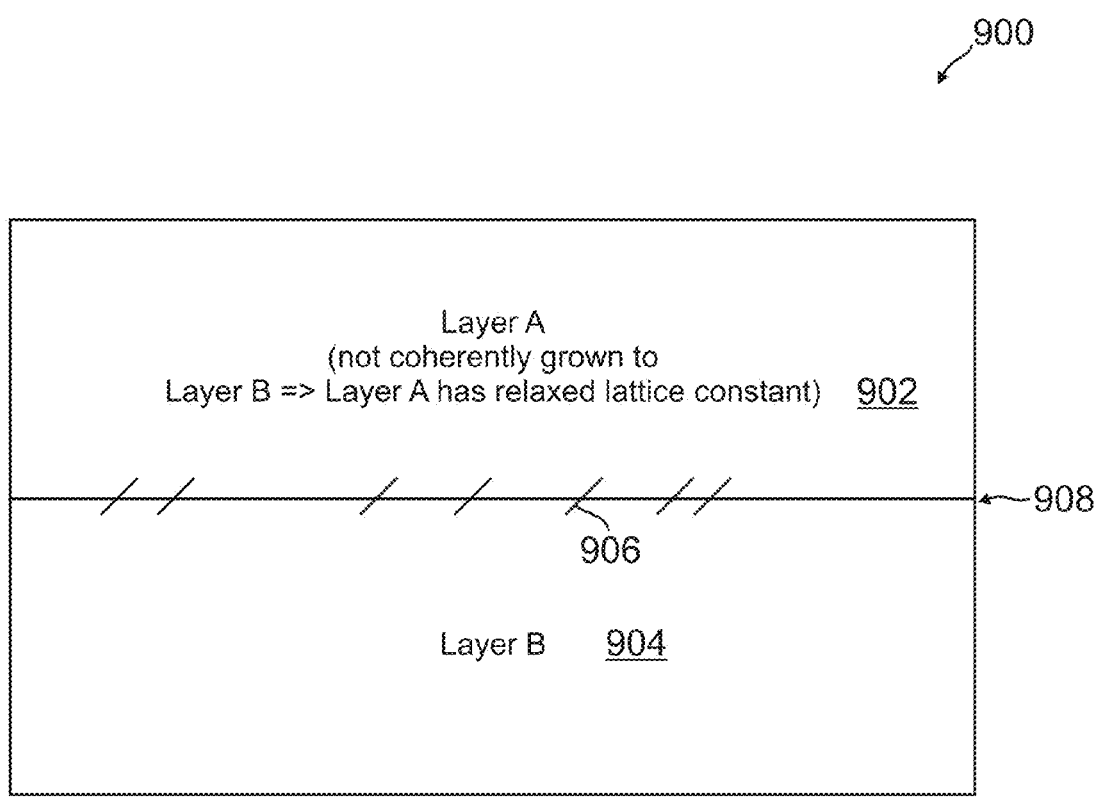
FIG. 9 is a cross-sectional schematic of an embodiment of the present invention.

More generally, the present invention discloses, as shown in FIG. 9, an epitaxial structure 900 comprising a first layer 902 (layer A) on a second layer 904 (layer B), wherein the first layer 902 is a nitride (AlInGaN) layer comprising a lattice constant that is partially or fully relaxed; and one or more dislocations 906 (e.g., MDs) at a heterointerface 908 between the first layer 902 and the second layer 904. The layer A 902 is not grown coherently to the layer B 904 in order to achieve the layer A 902 with the relaxed lattice constant. The lattice constant of layer A 902 can be lower than, or higher than, the lattice constant of layer B 904. To achieve this lattice mismatch, layers A 902 and B 904 may be made of different alloys, for example. The second layer 904 itself may also be partially relaxed. The thickness of layer A is larger than the critical thickness to generate MDs. The critical thickness may range from several nm to several micrometers, for example, and may depend on composition, doping, and crystalline orientation (the latter dependency is quite important).

So, according to the present invention, the first layer 902 is relaxed against the second layer 904. In other words, the lattice constant in the first layer 902 in the horizontal direction is not the same as that in the second layer 904.

The dislocations 906 may include, but are not limited to, MDs. Typically, the dislocations are localized around the heterointerface 908 and do not penetrate through layers above the heterointerface 908. A number (n) of threading dislocations per unit area in the substrate or second layer B 904 in the range $10^3$-$10^6$ per unit area (e.g., $10^3$-$10^6$ per $cm^{-2}$) is desirable, because device performance worsens for $n>10^6$, and MDs cannot be generated effectively for $n<10^3$.

Figure 10:
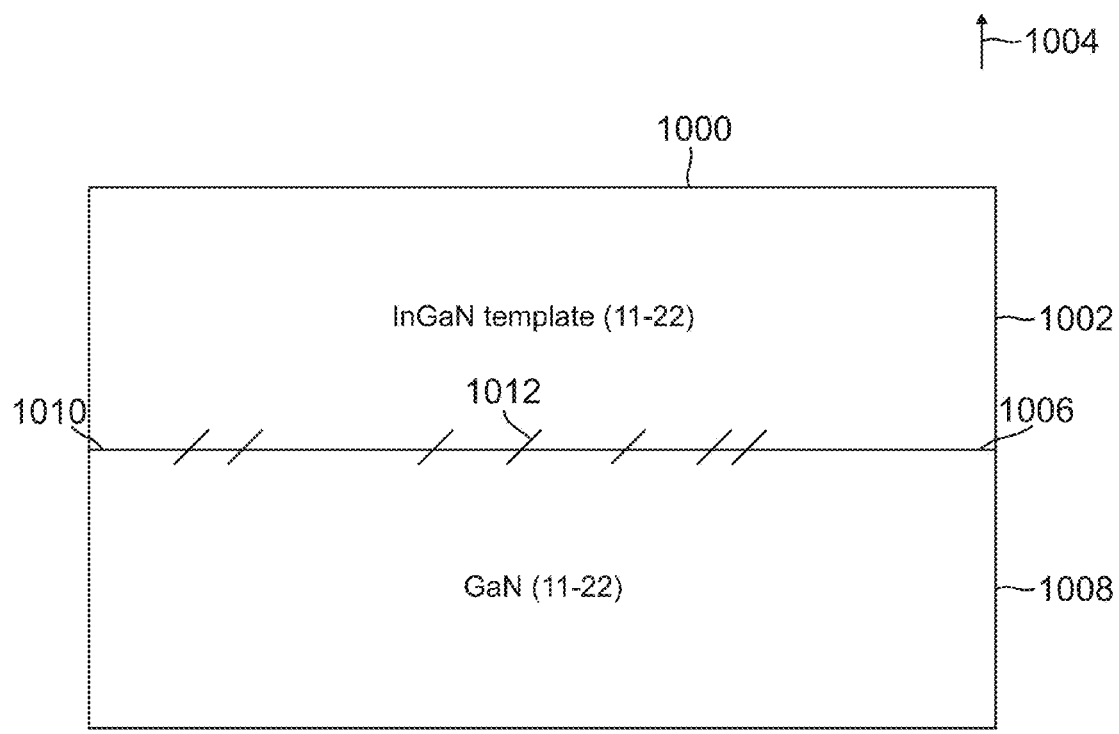
FIG. 10 is a cross-sectional schematic of an InGaN template on a GaN substrate, according to the present invention.

FIG. 10 illustrates an example where the growth plane (or top surface) 1000 of the first layer 1002 is a semipolar plane such as, but not limited to, (11-22), (10-1-1) or (10-1-3) planes, etc. In other words, the top surface 1000 of the layer A 1002, upon which subsequent device layers (e.g., n-type, p-type, and active layers) are grown, is the semipolar plane. Semipolar planes are defined as crystal planes with nonzero h or k or i index and a nonzero l index in the (hkil) Miller-Bravais indexing convention. Typically, the growth direction 1004 of the layer A 1002 is a semipolar growth direction. In the case of FIG. 10, the first layer 1002 is an InGaN (11-22) template grown on a semipolar (11-22) plane 1006 of the second layer 1008, wherein the second layer 1008 is a GaN (11-22) substrate. FIG. 10 further illustrates an interface 1010 (between the first layer 1002 and the second layer 1008) with MDs 1012. The lattice constant (of the InGaN template 1002) toward [11-23] (in-plane projection of c-axis) is relaxed while the lattice constant (of the InGaN template 1002) toward the m-axis is not relaxed. This indicates further MD due to lattice mismatch along [11-23] can be suppressed.

Thus, the (11-22) semipolar template may be relaxed along the [11-23] direction (in plane projection of the c-axis) and not relaxed along the m-axis. For different planes or crystallographic orientations, the relaxed and non-relaxed directions might be different and can be derived [1]. However, the relaxation is typically along one direction and not relaxed in the perpendicular direction [1]. Generally, the critical thickness for the formation of MDs can be calculated for both directions.

Typically, the in-plane lattice constant parallel to c-projection is relaxed, but the relaxed direction and non-relaxed direction does depend on the semipolar orientation and/or alloy composition of the underlayer and/or substrate. For commonly used semipolar planes, the lattice constants that are not coherent are typically the in-plane lattice constants parallel to the projection of the c-axis (which are different from both a, c).

As such, it is not necessary for the relaxed direction to be always along the c-projection and the non-relaxed direction always perpendicular to the c-projection. However, since basal plane slip is the dominant strain-relaxation mechanism owing to the crystal structure of semipolar wurtzite III-nitrides, MDs with line direction perpendicular to the c-projection would likely be formed first. Consequently, initial relaxation would be along the c-projection (relaxation direction is perpendicular to MD direction). If the strain energy in the film is large enough, the in-plane direction perpendicular to the c-axis can experience relaxation as well. In one embodiment, the present invention may calculate a critical thickness for formation of MDs for both directions. Then, MDs would be caused when the layer thickness reaches the corresponding critical thickness. Thus, once the layer thickness reaches critical thickness for a direction, the layer would be relaxed in the corresponding direction.

The degree of relaxation may depend on lattice constant, and mechanical properties depending on orientation and lattice directions [1].

Process Steps

Figure 11:
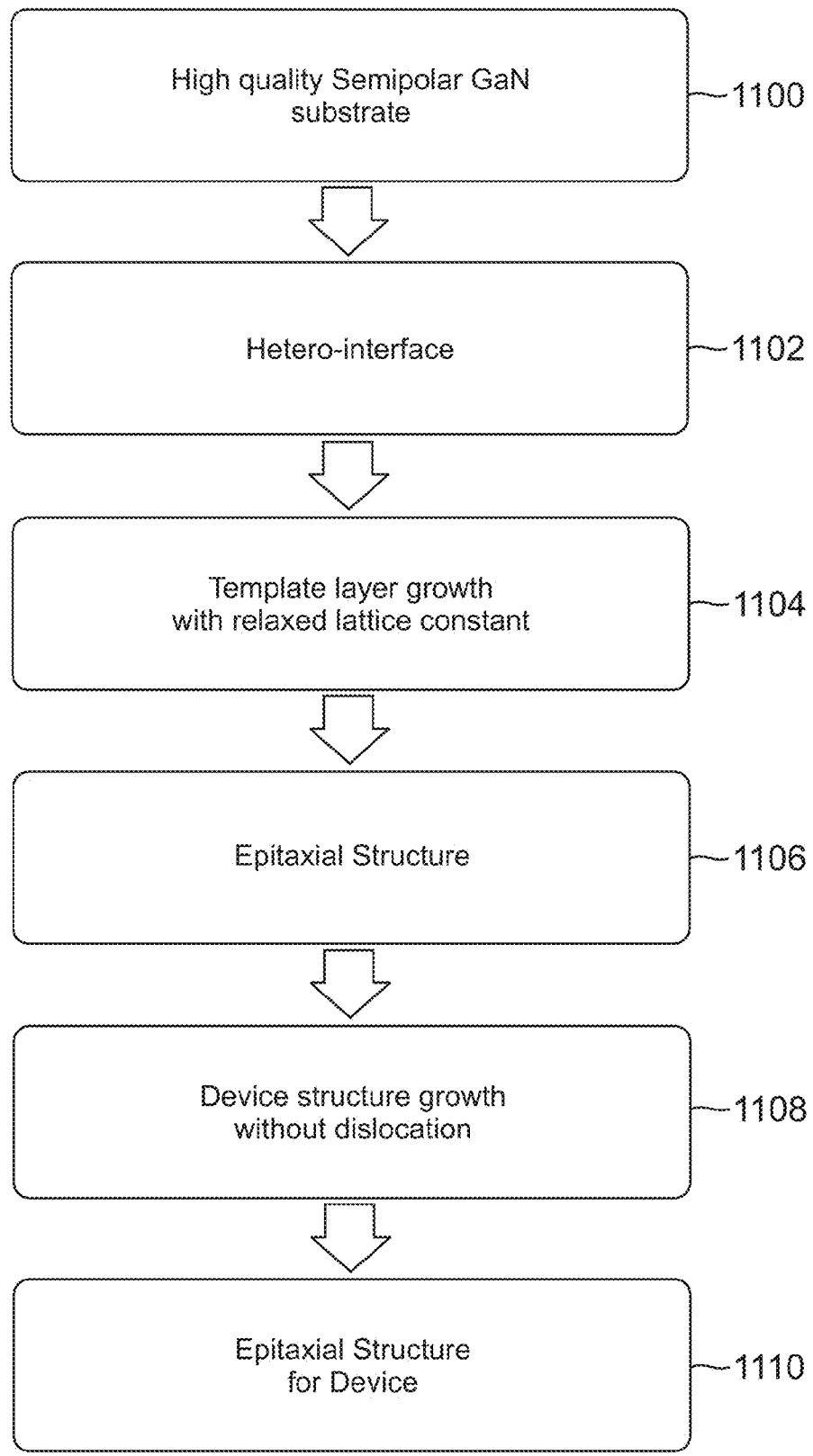
FIG. 11 illustrates a method of fabricating a device according to the present invention.

FIG. 11 is a flowchart illustrating a method of fabricating the epitaxial structure of the present invention (a III-Nitride device, for example). The method comprises the following steps.

Block 1100 represents providing or employing a substrate, a high quality semipolar GaN substrate for example, that forms a heterointerface (Block 1102) with a subsequently grown template layer. The template layer may be a first layer and the substrate may be a second layer, for example. A number (n) of threading dislocations per unit area (e.g., per $cm^2$) in the substrate layer may be in the range $10^3$-$10^6$ per unit area (e.g., per $cm^2$), because device performance worsens for n>$10^6$, and MDs cannot be generated effectively for n<$10^3$.

Block 1104 represents growing the template layer on the substrate, or depositing or growing a first layer that is a nitride (AlInGaN) layer having a lattice constant that is partially or fully relaxed, on the second layer, wherein there are one or more dislocations at a heterointerface between the first layer and the second layer. The template may be grown non-coherently (i.e. the in-plane lattice constant of the template layer is not the same as that of the substrate layer) on the GaN substrate, resulting in the template layer having a relaxed lattice constant. Thus, the III-Nitride template may be grown non-coherently on a substrate having a different material composition than the III-Nitride template. The first layer may comprise more than two layers, such as $In_{0.1}GaN/In_{0.05}GaN/GaN$, and at each interface there may be dislocations allowing relaxed epitaxial films.

Block 1106 represents the end result of the above steps, an epitaxial structure comprising at least a first layer (template layer) that is a semipolar nitride (AlInGaN) layer having a lattice constant that is partially or fully relaxed, deposited on a second layer (e.g., substrate), wherein there are one or more dislocations at a heterointerface between the first layer and the second layer. The dislocations may be MDs, the dislocations may be localized around the heterointerface (heterointerfaces, in the case where the first layer comprises more than two layers), and the dislocations may not penetrate through layers above the heterointerface(s).

A growth plane (i.e., top surface upon which subsequent layers, such as device layers, are deposited) of the first layer (template) may be a semipolar plane such as (11-22), (10-3-1) or (10-1-3) and other various semipolar planes.

Block 1108 represents growing a device structure, e.g., without dislocations on the template layer. The growing may include growing the III-Nitride device coherently on the III-Nitride template.

Block 1110 represents the end result of the method, an III-Nitride optical device or device structure fabricated on the first layer. The III-Nitride optical device or structure may include $AlIn_xGaN$ (x>0) QWs or barriers/active layers. The $AlIn_xGaN$ (x>0) QWs or barriers/active layers may include x more than 20% (e.g., with or without Al). The III-Nitride optical device may be an LED or LD comprising a light emitting active layer between an n-type layer and a p-type layer. For example, the optical device may be a green LD comprising high In composition QWs that enable light emission having a peak intensity in a green wavelength range.

The QW thickness may be at least 3 nm.

The III-Nitride optical device typically includes no new dislocations inside the device structure, in particular around one or more active layers of the optical device, or dislocations are far from the active layers (e.g., at least 50 nm from the active layer), for example.

The structure is typically grown by conventional Molecular Beam Epitaxy (MBE) or Metal organic Chemical Vapor Deposition (MOCVD), for example, although other deposition methods are also possible.

Additional layers, structure, contacts, or elements may be added as are known in the art to fabricate optoelectronic devices.

Possible Modifications

The second layer may comprise different materials, such as, but not limited to, bulk AlInGaN, a high quality GaN substrate, or a foreign substrate such as m-sapphire or spinel substrates.

As noted above, the first layer is typically InGaN comprising an In composition of at least several percent (e.g. at least 3-10%). In this case, the second layer could be GaN, for example. However, the first layer A may comprise other materials. For example, the first layer may be AlGaN comprising an Al composition of at least several percent. In this case the second layer could be GaN, for example. If Al composition is small, the critical thickness is large. But for this latter case, the present invention may introduce MDs by growing a thick layer.

The first layer may comprise more than two layers, such as $In_{0.1}GaN/In_{0.05}GaN/GaN$, wherein at each interface between the layers there exist dislocations allowing relaxed epitaxial films.

The present invention enables the fabrication of superbright green LEDs, green LDs, amber LEDs, red LEDs based on semipolar growth, and AlGaN-based deep UV LEDs and LD based on semipolar GaN.

Figure 12:
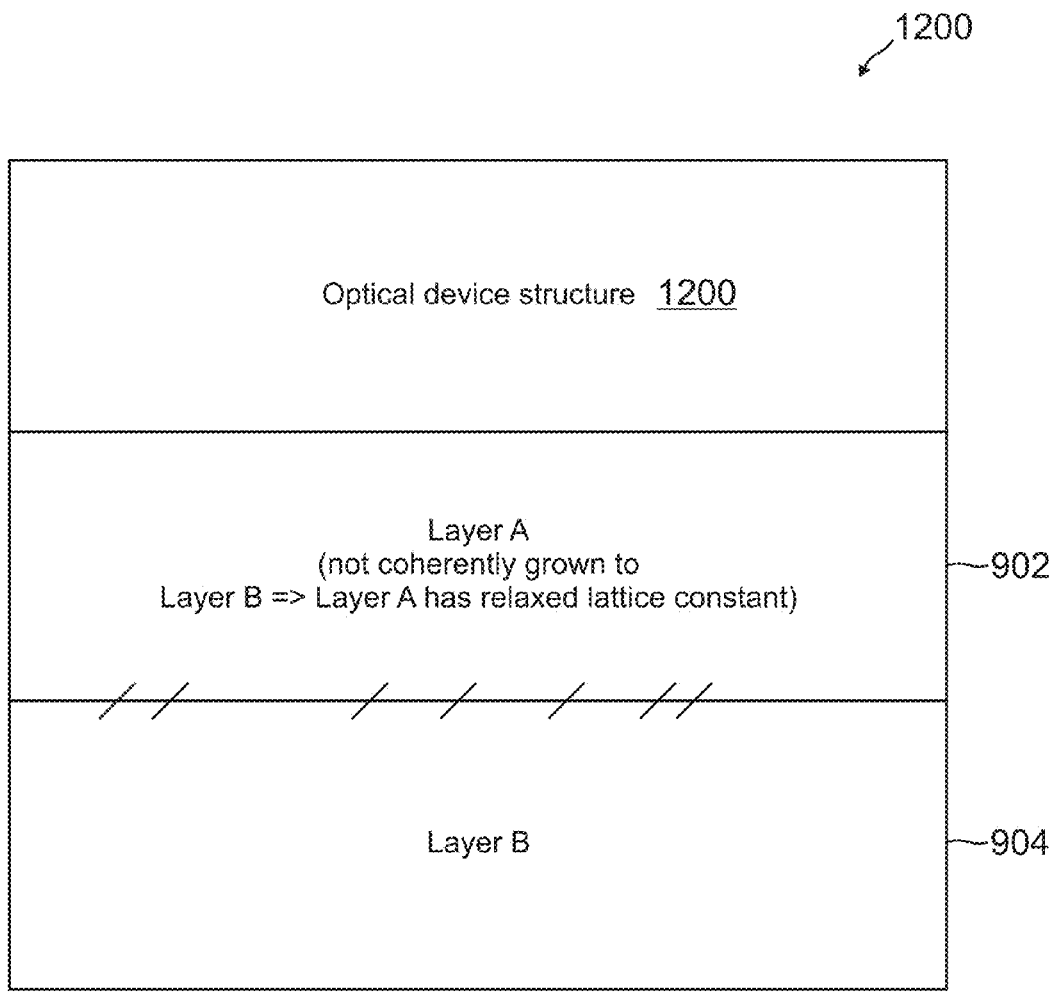
FIG. 12 is a cross-sectional schematic of a device fabricated using the embodiment of FIG. 9.

FIG. 12 illustrates an example of an optical device structure 1200 (such as, but not limited to, an LED or LD) on the first layer 902 (Layer A) (e.g., as illustrated in FIG. 9).

The optical device 1200 may include $AlIn_xGaN$ (x>0) active layers or QWs (with an In composition x more than 0.2 (20%)), for example. The In composition of the active layer may be high enough to emit light corresponding to longer wavelengths, e.g., green wavelengths. However, it is preferable not to include any new dislocation(s) in the optical device structure.

Figure 13:
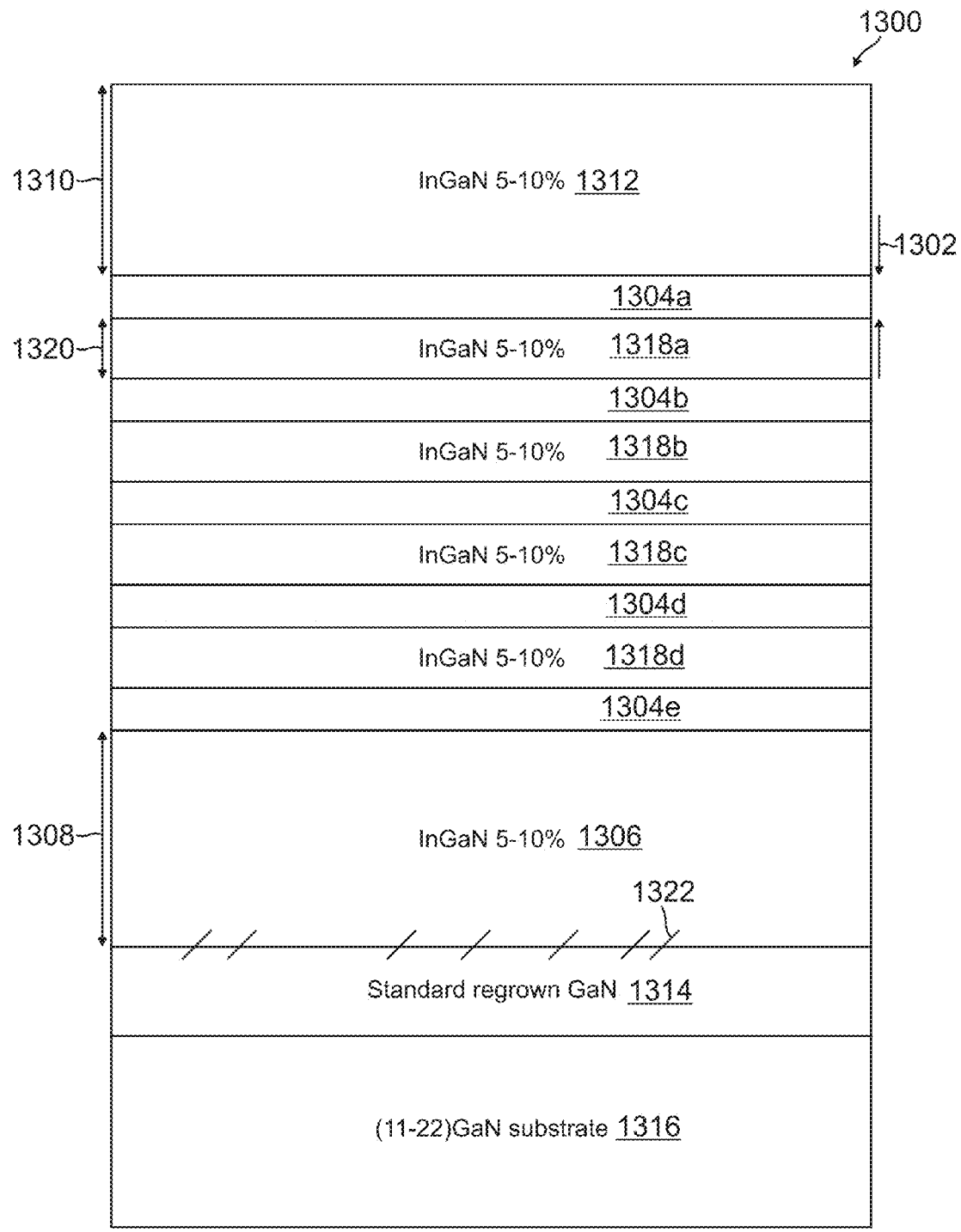
FIG. 13 is a cross-sectional schematic of a green LD based on a (11-22) GaN substrate, and comprising thick QWs.

Owing to the InGaN template 902, the present invention can grow thick (e.g., more than 3 nm thick) and high quality QWs having high (e.g., 15%-30%) In composition. FIG. 13 illustrates a green LD 1300 (e.g., emitting green light or light having a peak emission intensity at green wavelengths) with thick (e.g., 8 nm thickness 1302), high In composition (15-30%) QWs 1304a, 1304b, 1304c, 1304d, 1304e that are the light emitting active layers. The first layer 1306 acting as an InGaN template is also thick (e.g., 1000 nm thickness 1308), contains 5%-10% In, and acts as a cladding layer. A p-type (e.g. Mg doped) 700 nm thick 1310 InGaN (5-10% In composition) layer 1312 is on the layer 1304a. The InGaN template 1306 is epitaxially grown on a standard regrown GaN template 1314, which is grown on a (11-22) GaN substrate 1316. The device layers further include InGaN layers 1318a, 1318b, 1318c, 1318d with 5-10% In composition (serving as QW barriers, for example) and having a thickness 1320 of e.g., 8 nm. In the device layers, lattice mismatch is typically kept small to prevent MDs in the device layers. Also shown are MDs 1322 at the interface between the template 1306 and standard regrown GaN 1314. Also shown is the top surface 1324 of the substrate 1316 upon which layers 1314 and 1316 are grown, wherein the top surface 1324 is a (11-22) semipolar plane, and the top surface 1328 of the template 1306, upon which active layers 1304a-e are grown, wherein top surface 1328 is also a (11-22) semipolar plane. However, as discussed, other semipolar or nonpolar planes may be used.

Figure 14:
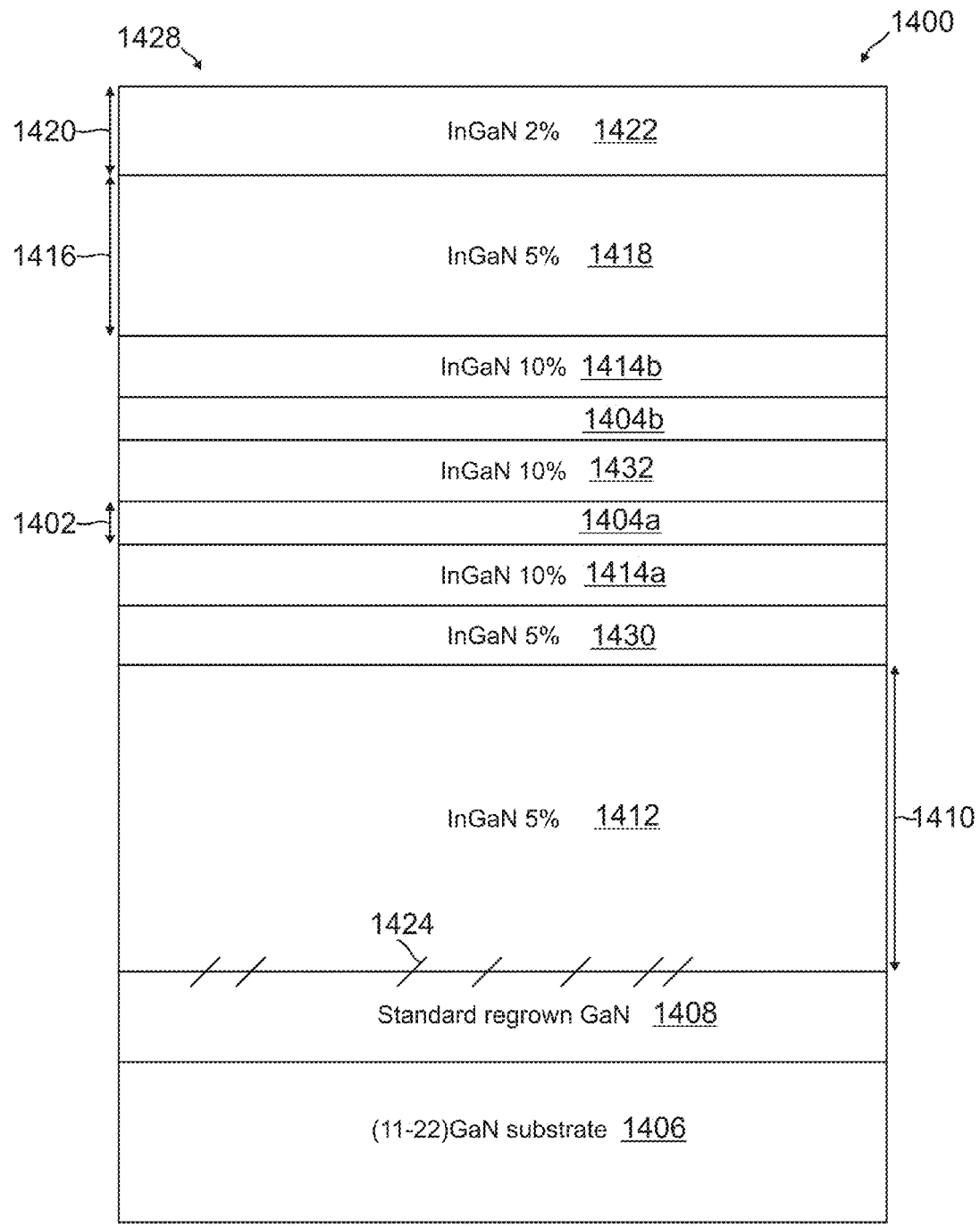
FIG. 14 is a cross-sectional schematic of a green LD with thin QWs.

FIG. 14 illustrates a green LD 1400 (e.g., emitting green light or light having a peak emission intensity at green wavelengths) with thin (e.g. 3 nm thickness 1402) QWs 1404a, 1404b (light emitting active layers), comprising a (11-22) GaN substrate 1406, a standard GaN template 1408 on the GaN substrate 1406, a 1000 nm thick 1410 InGaN template layer 1412 (with, e.g., 5% In composition, also acting as the cladding layer) on the standard regrown layer 1408, followed by the thin QWs 1404a, 1404b (e.g., InGaN with 30% In) and InGaN separate confinement heterostructure (SCH) layers 1414a, 1414b, (e.g., InGaN with 10% In) on the InGaN template 1412. The QWs 1404a, 1404b and SCH 1414a, 1414b have a higher In composition than the InGaN template 1412 and cladding. A 50 nm thickness 1416 InGaN layer 1418 (5% In) is on the SCH layer 1414b. A 700 nm thick 1420 InGaN layer 1422 (2% In composition, p-type doped, e.g. with Mg) is on layer 1418. Also shown are MDs 1424 at the interface between the template 1412 and standard regrown GaN 1408. The refractive index difference Δn between the active region 1404a, 1404b and the cladding layers 1412 is Δn=0.05.

For the nonpolar or semipolar case, the present invention can increase QW thickness up to more than 3 nm without, or with less QCSE.

Preferably, the optical device 1300, 1400 includes no dislocations inside the device structure, in particular around active layers 1304a-e and 1404a-b. Alternatively, the dislocations are far from the active layer 1304a-e, 1404a-b (e.g. distance between the MDs 1322, 1424 and the QWs 1304a-e, 1404a-b is more than 50 nm, or preferably more than 100 nm, for example), as shown in FIGS. 13 and 14. In the device of FIG. 14, for example, the lattice constant increases from the bottom 1426 towards the active region 1404a. However, the in-plane lattice constant remains constant directly under the active layer 1404a, and decreases from above the QW active layer 1404b towards the top 1428 of the optical device 1400, except for some layers such as electron blocking layers. In other words, the active region 1404a, 1404b is grown coherently on the underlying layers 1412 and any heterointerfaces with MDs 1424 are sufficiently (50-100 nm) removed from the active region 1404a-b. Also shown in FIG. 14 is InGaN layer 1430 with 5% In, between the template layer 1412 and SCH layer 1414a, and a QW barrier layer 1432.

Figure 15:
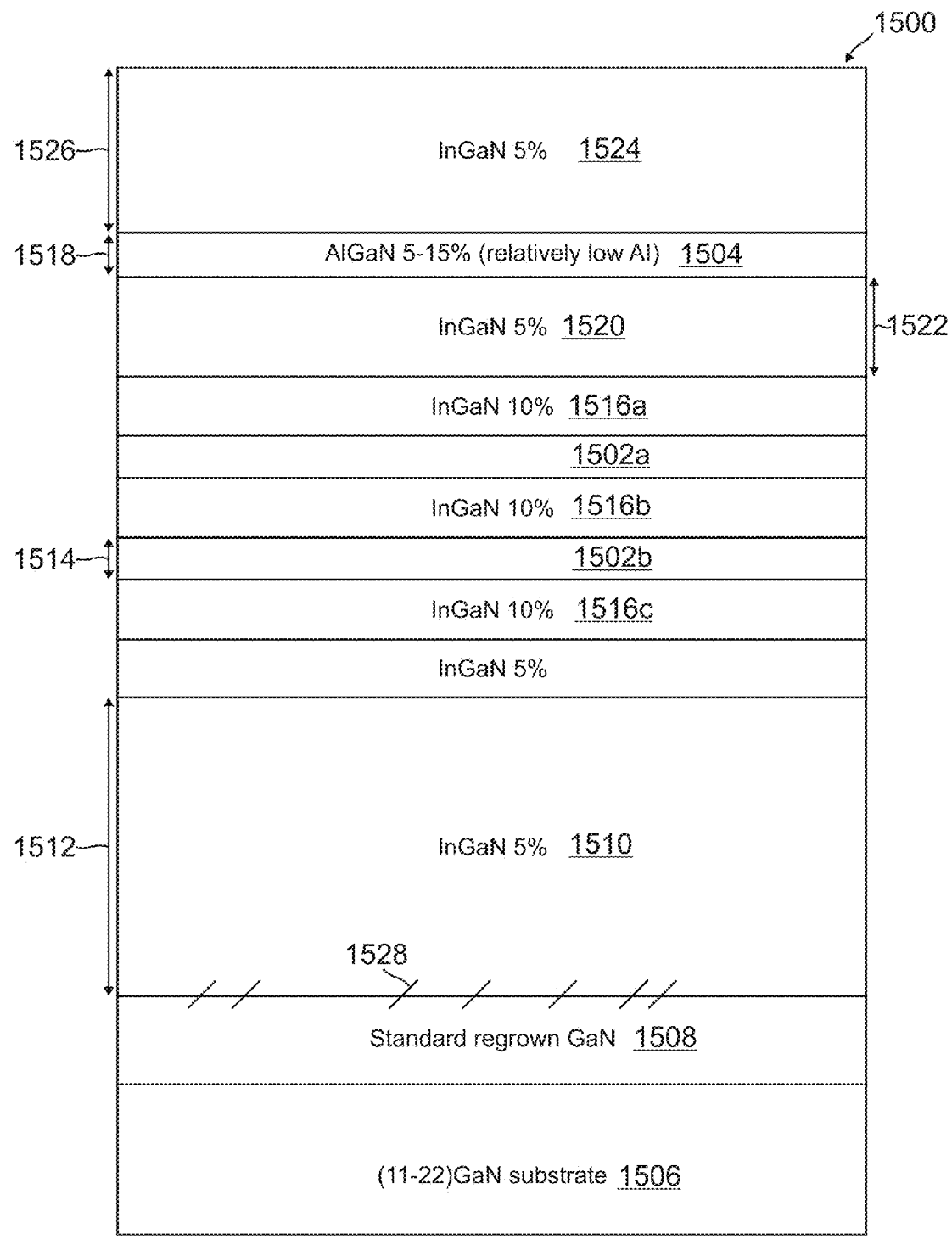
FIG. 15 is a cross-sectional schematic of a green LD with thin QWs and an electron blocking layer.

FIG. 15 illustrates a green LD structure 1500 (i.e., emitting green light or light having a peak emission intensity at one or more green wavelengths) with one or more thin QWs 1502a, 1502b and an AlGaN electron blocking layer (EBL) 1504 with relatively low Al content, e.g. 10-15% or 5-15% (e.g., to prevent electron overflow). The LD 1500 comprises of a (11-22) GaN substrate 1506, a standard GaN template 1508 on the GaN substrate 1506, an InGaN template layer 1510 (with, e.g., 5% In composition and a having a thickness 1512 of 1000 nm) on the GaN template 1508, followed by InGaN layers 1516a, 1516b, 1516c (with 10% In composition) and the thin QWs 1502a, 1502b (having a 3 nm thickness 1514 with 15-20%, or 30%, In composition) separated by InGaN layers 1516b. InGaN layers 1516a, 1516b, 1516c with 10% In also act as QW barriers providing quantum confinement of carriers in the QWs 1502a, 1502b. Layers 1516a and 1516c may also be SCH layers. The EBL 1504, having a thickness 1518 of 20 nm, is between an $In_{0.05}GaN$ layer 1520 (5% In composition and having a thickness 1522 of 50 nm) and an $In_{0.05}GaN$ (5% In composition, p-type, e.g. Mg doped) layer 1524 having a thickness 1526 of 700 nm. The refractive index difference Δn between the active region 1502a, 1502b and the cladding layers 1510 is Δn=0.05. The AlGaN EBL layer 1504 may doped with Mg, however this is not necessary.

As shown in FIG. 15, for the present invention it is preferable to suppress MDs at the EBL's 1504 interface. Therefore, fabricating the EBL 1504 by grading the composition of the EBL layer 1504 with low Al composition, or using a GaN EBL 1504 or thin (and/or lattice matched) AlInN EBL layer 1504, to prevent dislocations, is preferable. The EBL 1504 may be graded in Al composition, AlInN, or low Al composition, for example.

Alternatively, or in addition, as shown in FIG. 15, the EBL 1504 should be located far (e.g., at least 50 nm) from the active layer 1502a, 1502b (to prevent the influence of MDs, which cause nonradiative recombination around them) thereby keeping high internal efficiency In addition, any other heterointerfaces (besides the QW/barrier heterointerface) should be kept far from active layer 1502a, 1502b, also as shown in FIG. 15. Also shown in FIG. 15 are MDs 1528 at the interface between InGaN template layer 1510 and GaN template layer 1508.

As noted above, one application of the present invention is a high quality InGaN template on GaN that be used to grow extremely high In composition device structures such as green LEDs, amber LEDs, red LEDs, and green light emitting LDs. For example, FIG. 16 and FIG. 17 show experimental results.

Figure 16:
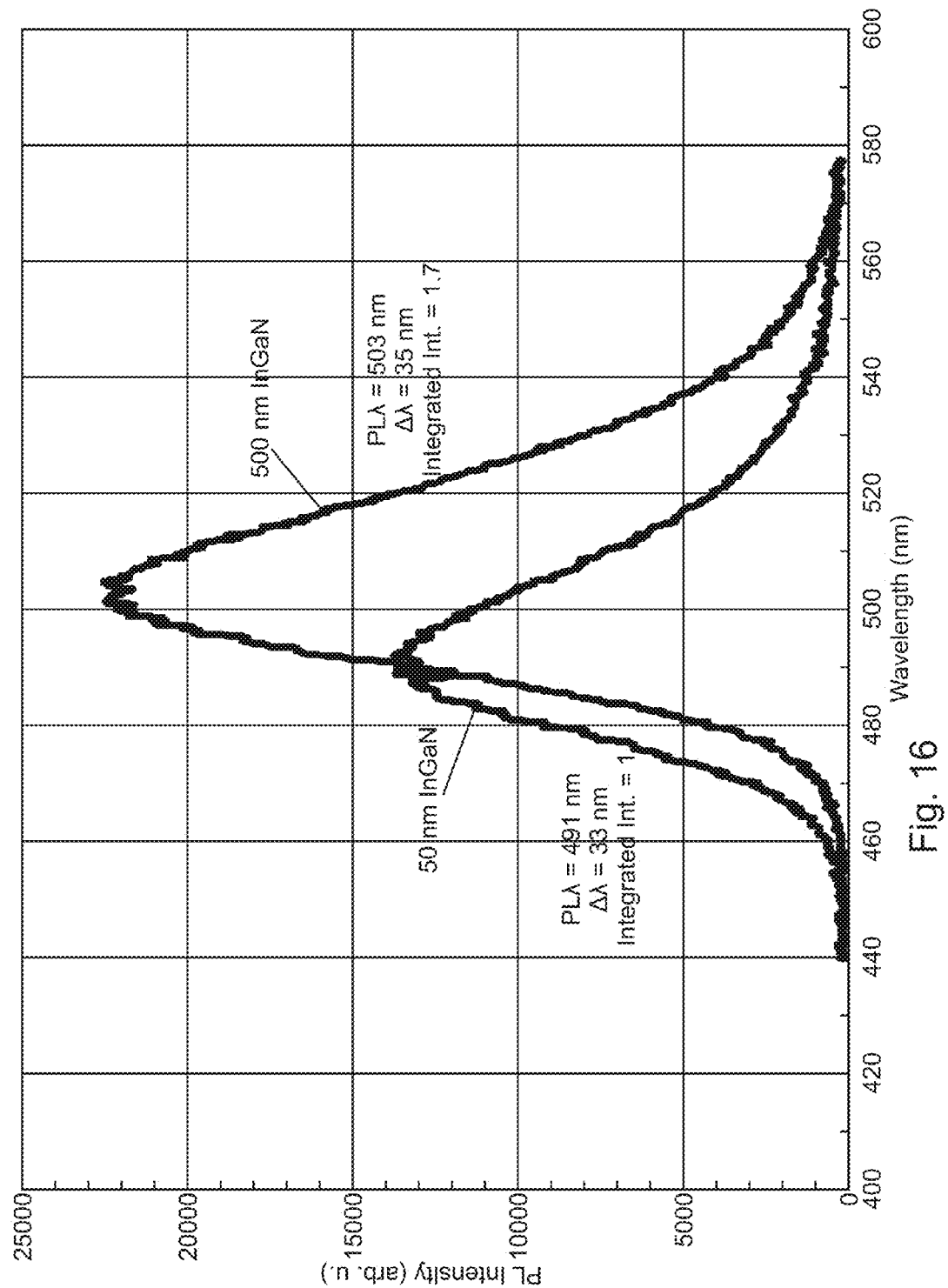
FIG. 16 shows room temperature (RT) photoluminescence (PL) spectra from two InGaN single QW devices grown on InGaN templates of different thicknesses (50/500 nm respectively), plotting intensity (arbitrary units) vs. wavelength (nm).
Figure 17:
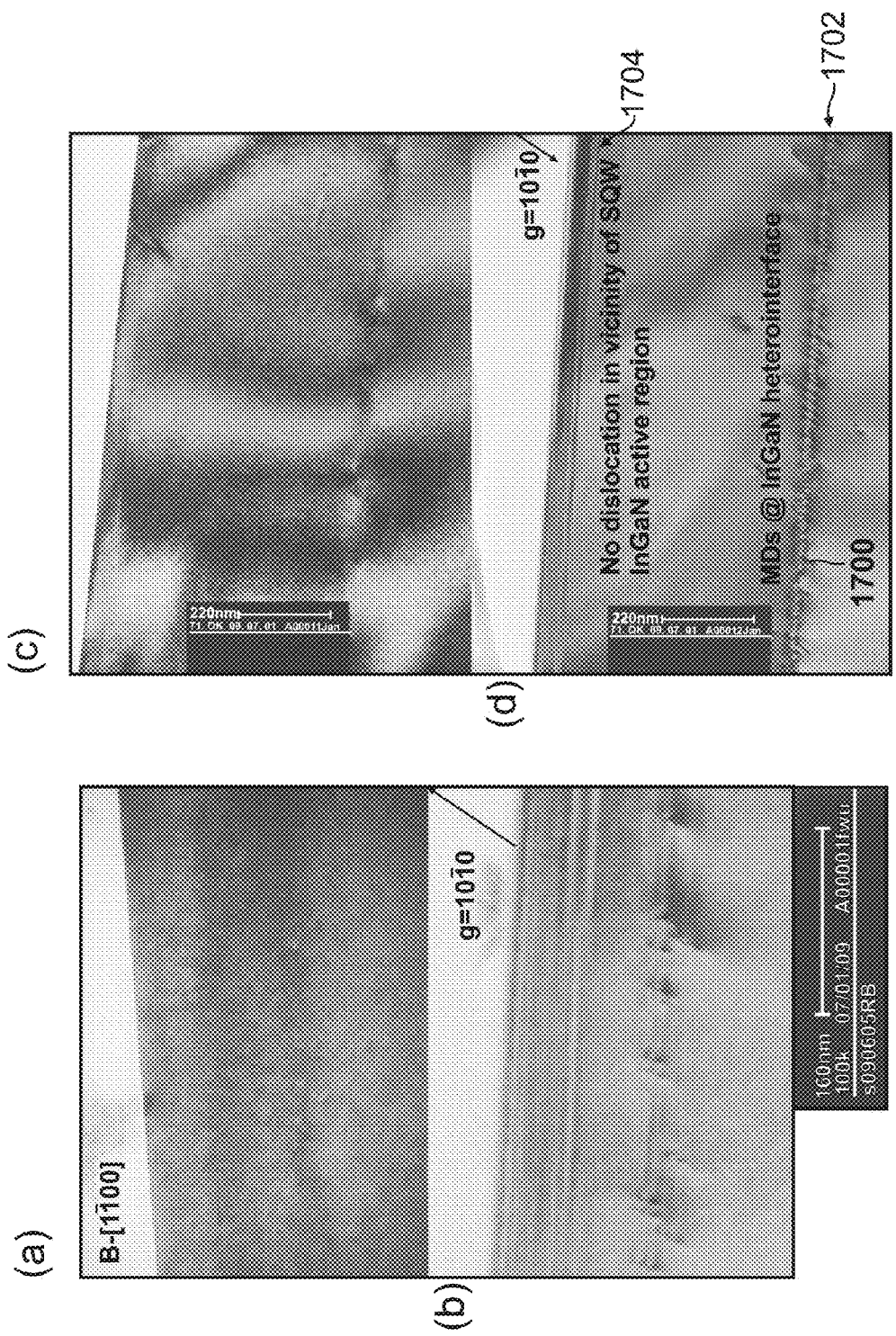
FIG. 17 shows (10-10) cross-section TEM images of the above mentioned devices in FIG. 16, for (a) the device on a 50 nm thick n-InGaN template (taken with B-[1-00]), (b) the device on a 50 nm thick n-InGaN template (taken with g=10-10), (c) the device grown on a 500 nm thick n-InGaN template (taken with B-[1-00]), and (d) the device grown on a 500 nm thick n-InGaN template (taken with g=10-10), wherein MDs are clearly observed at the InGaN/GaN heterointerface in (d) [2].

FIG. 16 shows that brighter photoluminescence (PL) (70% increase in intensity) and longer emission wavelength is obtained from a high-In content single quantum well (SQW) grown on a 500 nm thick InGaN (5-7% In) template grown on (11-22) GaN. Specifically, the PL intensity from the QW grown on the 50 nm thick InGaN layer peaks at a wavelength of 491 nm with a full width at half maximum (FWHM) ($\Delta\lambda$)=33 nm and an integrated intensity of 1, whereas the PL intensity from the QW grown on the 500 nm thick InGaN layer peaks at a wavelength of 503 nm with a FWHM ($\Delta\lambda$)=35 nm and an integrated intensity of 1.7. The data in FIG. 16 was taken at room temperature and resulted from excitation at a wavelength of 405 nm.

FIG. 17(a)-(d) [2] are images of the devices measured in FIG. 16. FIG. 17(b) shows a (10-10) cross section for the device on a 50 nm thick InGaN template, and FIG. 17(d) shows that TEM imaging ((10-10) cross-section) of the sample on the 500 nm thick n-type InGaN layer in FIG. 16 revealed MDs 1700 at the InGaN/GaN heterointerface 1702, sufficiently far away from the SQW active region 1704. There are no dislocations in the vicinity of the SQW InGaN active region 1704.

Non-polar templates and substrates may be used as well.

Devices have the same orientation as the GaN substrate orientation. For example, if an m-plane substrate is used, an m-plane device will be grown. If the present invention uses a (11-22) GaN substrate, a (11-22) semipolar device will be grown on the substrate.

MDs or any kinds of defects will lower LED power. Growing high In % InGaN on GaN is quite difficult because of the presence of the large lattice mismatch. Prior to the present invention, high-quality InGaN with In %>30% could not be grown. Using the method of the present invention, InGaN with In %>30% may be grown on GaN.

Advantages and Improvements

So far, there have been no reports of ultra-bright LEDs and high-performance LDs emitting in the green spectral regions (or in longer wavelength regions beyond blue) based on semipolar and nonpolar orientations. This is partially because of MDs, or stacking faults, at heterointerfaces, in particular at the interface between barrier layers and QWs (in other words, material issues). Still, previous studies have used GaN or InGaN barriers (with low In composition). Therefore, current devices have extremely large lattice mismatches around the QWs. This causes poor crystalline quality or dislocations/stacking faults. The same phenomena can be observed at the interface between the guiding layer and cladding layer (e.g., InGaN guiding/AlGaN cladding) in LDs.

The reason for using nonpolar and semipolar orientations is clear based on previous results. Small, or eliminated QCSE (quantum confined Stark effect) results in higher internal efficiency, which enables the production of high power LEDs and LDs in the region beyond blue (green/amber/red LED based on nitride, and green LDs). However, truly high-performance optical devices cannot be achieved until the above mentioned material issues are overcome.

The present invention can supply high quality template layers with a relaxed lattice constant, by using a heterointerface including MDs. On the relaxed layer, e.g., relaxed InGaN template, the present invention can grow high In composition layers (high In composition QWs) more easily as compared to the case of direct growth (i.e., without use of InGaN templates as intermediate layers) on GaN. This enables the present invention to fabricate high performance LEDs and LDs grown in semipolar orientations, e.g. LEDs or LDs based on, or grown on, the (11-22) plane of GaN and emitting, for example, green light. As noted above, however, other semipolar planes may be used.

However, optoelectronic devices (including LEDs, LDs), solar cells, and electronic devices (e.g., transistors such as high electron mobility transistors) may be grown on the template layer of the present invention.

Further information on the present invention can be found in [1], [2] and [3].

REFERENCES

The following references are incorporated by reference herein.

[1] "Partial strain relaxation via misfit dislocation generation at heterointerfaces in (Al,In)GaN epitaxial layers grown on semipolar (11-22) GaN free standing substrates," by Anurag Tyagi, Feng Wu, Erin C. Young, Arpan Chakraborty, Hiroaki Ohta, Rajaram Bhat, Kenji Fujito, Steven P. DenBaars, Shuji Nakamura, and James S. Speck, Applied Physics Letters 95, 251905 (2009).

[2] "Lattice Tilt and Misfit Dislocations in (11-22) Semipolar GaN Heteroepitaxy," by Erin C. Young, Feng Wu, Alexey E. Romanov, Anurag Tyagi, Chad S. Gallinat, Steven P. DenBaars, Shuji Nakamura, and James S. Speck, Applied Physics Express 3 (2010) 011004.

[3] Presentation Slides given by James S. Speck, entitled "Progress in Nonpolar Materials and Devices," at the 2009 Annual Review for the Solid State Lighting and Energy Center (SSLEC), University of California, Santa Barbara (Nov. 5, 2009).

[4] A. A. Yamaguchi, Phys. Stat. Sol (c) 5, 2329 (2008).

[5] A. A. Yamaguchi, Appl. Phys. Lett. 94, 201104 (2009).

[6] A. A. Yamaguchi, Jpn. J. Appl. Phys. 46, L789 (2007).

[8] Physics of Optical Devices, by S. L. Chuang P149.

[9] I. Vurgaftman and J. Meyer, J. Appl. Phys. 94, 3675 (2003).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Moreover, it is not intended that the present invention be bound to any of the scientific principles or theories described herein. Many modifications and variations are possible in light of the above teaching. It is intended that the scope of the invention be limited not by this detailed description, but rather by the claims appended hereto.

What is claimed is:

1. An epitaxial optoelectronic or electronic device structure, comprising:
    a first layer that is a semipolar or nonpolar III-nitride layer having a lattice constant that is partially or fully relaxed, deposited on a top surface of a second layer that is a semipolar or nonpolar III-nitride layer, wherein:
        there are one or more misfit dislocations at a heterointerface between the first layer and the second layer,
        the first layer and the second layer have a different III-nitride composition,
        the top surface of the second layer is a nonpolar or semipolar plane, and
        a top surface of the first layer is a nonpolar or semipolar plane; and
    one or more nonpolar or semipolar active layers, without misfit dislocations, on or above the first layer.

2. The epitaxial structure of claim 1, wherein the dislocations are localized around the heterointerface.

3. The epitaxial structure of claim 1, wherein the dislocations do not penetrate through layers above the heterointerface.

4. The epitaxial structure of claim 1, wherein the semipolar plane is a (11-22), (10-1-1), or (10-1-3) plane.

5. The epitaxial structure of claim 1, wherein the second layer is a bulk III-nitride substrate.

6. The epitaxial structure of claim 1, wherein:
the second layer is a GaN substrate or GaN layer,
the first layer comprises InGaN, AlGan, or AlInGaN, and
the one or more active layers on the first layer comprise Indium and Gallium.

7. The epitaxial structure of claim 1, wherein the first layer is InGaN having an In composition of at least 3-10%, and the second layer is GaN.

8. The epitaxial structure of claim 1, wherein the first layer is AlGaN and the second layer is GaN.

9. The epitaxial structure of claim 1, wherein the first layer comprises more than two layers and at each interface there exists dislocations allowing relaxed epitaxial films.

10. The epitaxial structure of claim 1, wherein the optoelectronic device structure comprises semipolar or nonpolar III-Nitride optical device structure layers on the first layer, the optical device structure layers including the one or more active layers and electron blocking layer on or above the one or more active layers.

11. The epitaxial structure of claim 10, wherein the semipolar or nonpolar III-Nitride optical device structure layers include one or more semipolar or nonpolar AlIn$_x$GaN (x>0) quantum wells.

12. The epitaxial structure of claim 11, wherein x is more than 20%.

13. The epitaxial structure of claim 11, wherein the quantum wells are at least 3 nm thick.

14. The epitaxial structure of claim 10, wherein the semipolar or nonpolar III-Nitride optoelectronic device structure is an ultraviolet, red, amber, or green light emitting diode or laser diode structure comprising the one or more light emitting active layers between an n-type layer and a p-type layer.

15. The epitaxial structure of claim 14, wherein the semipolar or nonpolar optoelectronic device structure is a green laser diode, and the one or more active layers comprise high In composition quantum wells that enable light emission having a peak intensity in a green wavelength range.

16. The epitaxial structure of claim 10, wherein the semipolar or nonpolar III-Nitride optoelectronic device structure includes no new dislocations around the one or more active layers.

17. The epitaxial structure of claim 10, wherein the epitaxial structure is on a GaN substrate and a number (n) of threading dislocations per unit area in the substrate layer is in a range $10^3$-$10^6$ per cm$^2$.

18. The epitaxial structure of claim 1, wherein the first layer has a thickness greater than or equal to a critical thickness for strain relaxation using basal plane slip along a (0001) plane inclined with respect to the top surface of the first layer.

19. The epitaxial structure of claim 1, wherein:
the optoelectronic device structure comprises a semipolar or nonpolar III-Nitride optical laser diode device structure,
the device structure comprises the first layer comprising a first cladding layer, an electron blocking layer on the one or more active layers, and a second cladding layer on the electron blocking layer,
the first layer comprises InGaN, AlGaN, or AlInGaN, the one or more active layers comprise Indium, and the electron blocking layer comprises AlGaN or GaN, and
the optical laser diode device structure emits light having a peak intensity at a wavelength corresponding to an ultraviolet wavelength or longer.

20. The epitaxial structure of claim 19, wherein dislocations are at least 50 nm from the active layer.

21. The epitaxial structure of claim 1, wherein the first layer has a first thickness and first composition comprising Indium, the second layer is Gallium Nitride, and the one or more active layers have a thickness and composition of Indium wherein the device structure outputs at least a 70% increase in luminescence intensity and at a longer emission wavelength as compared to the device comprising the same thickness and composition for the one or more active layers, the same second layer, but having a 50 nm thick InGaN first layer with 5-7% Indium composition.

* * * * *